US009661781B2

(12) United States Patent
Anolik et al.

(10) Patent No.: US 9,661,781 B2
(45) Date of Patent: May 23, 2017

(54) REMOTE UNITS FOR DISTRIBUTED COMMUNICATION SYSTEMS AND RELATED INSTALLATION METHODS AND APPARATUSES

(71) Applicant: CORNING OPTICAL COMMUNICATIONS WIRELESS LTD, Airport (IL)

(72) Inventors: Rami Anolik, Beir Arie (IL); Ami Hazani, Ra'anana (IL)

(73) Assignee: Corning Optical Communications Wireless Ltd, Airport (IL)

( * ) Notice: Subject to any disclaimer, the term of this patent is extended or adjusted under 35 U.S.C. 154(b) by 554 days.

(21) Appl. No.: 14/444,447

(22) Filed: Jul. 28, 2014

(65) Prior Publication Data

US 2015/0035705 A1 Feb. 5, 2015

Related U.S. Application Data

(60) Provisional application No. 61/860,553, filed on Jul. 31, 2013.

(51) Int. Cl.
| | | |
|---|---|---|
| H05K 5/02 | (2006.01) | |
| H05K 7/20 | (2006.01) | |
| H01Q 1/00 | (2006.01) | |
| H01Q 1/22 | (2006.01) | |
| H01Q 21/28 | (2006.01) | |
| H04B 1/40 | (2015.01) | |

(52) U.S. Cl.
CPC ......... *H05K 7/20009* (2013.01); *H01Q 1/007* (2013.01); *H01Q 1/2216* (2013.01); *H01Q 1/2291* (2013.01); *H01Q 21/28* (2013.01); *H04B 1/40* (2013.01); *H05K 5/02* (2013.01); *H05K 7/20127* (2013.01)

(58) Field of Classification Search
CPC .... H05K 5/0026; H05K 5/003; H05K 5/0073; H05K 5/02; H05K 5/0204; H05K 7/20009; H04B 10/0775; H04B 10/1129; H04B 1/40
See application file for complete search history.

(56) References Cited

U.S. PATENT DOCUMENTS

| | | |
|---|---|---|
| 4,365,865 A | 12/1982 | Stiles |
| 4,449,246 A | 5/1984 | Seiler et al. |
| 4,573,212 A | 2/1986 | Lipsky |
| 4,665,560 A | 5/1987 | Lange |

(Continued)

FOREIGN PATENT DOCUMENTS

| | | |
|---|---|---|
| AU | 645192 B | 10/1992 |
| AU | 731180 B2 | 3/1998 |

(Continued)

OTHER PUBLICATIONS

Notice of Allowance for U.S. Appl. No. 14/855,896, mailed Nov. 9, 2016, 19 pages.

(Continued)

*Primary Examiner* — Matthew Nguyen
(74) *Attorney, Agent, or Firm* — C. Keith Montgomery

(57) ABSTRACT

Remote units are mounted in a support structure so that cooling air flow is not impeded by the support structure. The remote units may have RF communications circuitry and other components that generate heat in the provision of wireless services.

20 Claims, 5 Drawing Sheets

(56) References Cited

U.S. PATENT DOCUMENTS

| | | |
|---|---|---|
| 4,867,527 A | 9/1989 | Dotti et al. |
| 4,889,977 A | 12/1989 | Haydon |
| 4,896,939 A | 1/1990 | O'Brien |
| 4,916,460 A | 4/1990 | Powell |
| 4,939,852 A | 7/1990 | Brenner |
| 4,972,346 A | 11/1990 | Kawano et al. |
| 5,039,195 A | 8/1991 | Jenkins et al. |
| 5,042,086 A | 8/1991 | Cole et al. |
| 5,056,109 A | 10/1991 | Gilhousen et al. |
| 5,059,927 A | 10/1991 | Cohen |
| 5,125,060 A | 6/1992 | Edmundson |
| 5,187,803 A | 2/1993 | Sohner et al. |
| 5,189,718 A | 2/1993 | Barrett et al. |
| 5,189,719 A | 2/1993 | Coleman et al. |
| 5,206,655 A | 4/1993 | Caille et al. |
| 5,208,812 A | 5/1993 | Dudek et al. |
| 5,210,812 A | 5/1993 | Nilsson et al. |
| 5,260,957 A | 11/1993 | Hakimi |
| 5,263,108 A | 11/1993 | Kurokawa et al. |
| 5,267,122 A | 11/1993 | Glover et al. |
| 5,268,971 A | 12/1993 | Nilsson et al. |
| 5,278,690 A | 1/1994 | Vella-Coleiro |
| 5,278,989 A | 1/1994 | Burke et al. |
| 5,280,472 A | 1/1994 | Gilhousen et al. |
| 5,299,947 A | 4/1994 | Barnard |
| 5,301,056 A | 4/1994 | O'Neill |
| 5,325,223 A | 6/1994 | Bears |
| 5,339,058 A | 8/1994 | Lique |
| 5,339,184 A | 8/1994 | Tang |
| 5,343,320 A | 8/1994 | Anderson |
| 5,377,035 A | 12/1994 | Wang et al. |
| 5,379,455 A | 1/1995 | Koschek |
| 5,381,459 A | 1/1995 | Lappington |
| 5,396,224 A | 3/1995 | Dukes et al. |
| 5,400,391 A | 3/1995 | Emura et al. |
| 5,420,863 A | 5/1995 | Taketsugu et al. |
| 5,424,864 A | 6/1995 | Emura |
| 5,444,564 A | 8/1995 | Newberg |
| 5,457,557 A | 10/1995 | Zarem et al. |
| 5,459,727 A | 10/1995 | Vannucci |
| 5,469,523 A | 11/1995 | Blew et al. |
| 5,519,830 A | 5/1996 | Opoczynski |
| 5,543,000 A | 8/1996 | Lique |
| 5,546,443 A | 8/1996 | Raith |
| 5,557,698 A | 9/1996 | Gareis et al. |
| 5,574,815 A | 11/1996 | Kneeland |
| 5,598,288 A | 1/1997 | Collar |
| 5,606,725 A | 2/1997 | Hart |
| 5,615,034 A | 3/1997 | Hori |
| 5,627,879 A | 5/1997 | Russell et al. |
| 5,640,678 A | 6/1997 | Ishikawa et al. |
| 5,642,405 A | 6/1997 | Fischer et al. |
| 5,644,622 A | 7/1997 | Russell et al. |
| 5,648,961 A | 7/1997 | Ebihara |
| 5,651,081 A | 7/1997 | Blew et al. |
| 5,657,374 A | 8/1997 | Russell et al. |
| 5,668,562 A | 9/1997 | Cutrer et al. |
| 5,677,974 A | 10/1997 | Elms et al. |
| 5,682,256 A | 10/1997 | Motley et al. |
| 5,694,232 A | 12/1997 | Parsay et al. |
| 5,703,602 A | 12/1997 | Casebolt |
| 5,708,681 A | 1/1998 | Malkemes et al. |
| 5,726,984 A | 3/1998 | Kubler et al. |
| 5,765,099 A | 6/1998 | Georges et al. |
| 5,790,536 A | 8/1998 | Mahany et al. |
| 5,790,606 A | 8/1998 | Dent |
| 5,793,772 A | 8/1998 | Burke et al. |
| 5,802,173 A | 9/1998 | Hamilton-Piercy et al. |
| 5,802,473 A | 9/1998 | Rutledge et al. |
| 5,805,975 A | 9/1998 | Green, Sr. et al. |
| 5,805,983 A | 9/1998 | Naidu et al. |
| 5,809,395 A | 9/1998 | Hamilton-Piercy et al. |
| 5,809,431 A | 9/1998 | Bustamante et al. |
| 5,812,296 A | 9/1998 | Tarusawa et al. |
| 5,818,619 A | 10/1998 | Medved et al. |
| 5,818,883 A | 10/1998 | Smith et al. |
| 5,821,510 A | 10/1998 | Cohen et al. |
| 5,825,651 A | 10/1998 | Gupta et al. |
| 5,838,474 A | 11/1998 | Stilling |
| 5,839,052 A | 11/1998 | Dean et al. |
| 5,852,651 A | 12/1998 | Fischer et al. |
| 5,854,986 A | 12/1998 | Dorren et al. |
| 5,859,719 A | 1/1999 | Dentai et al. |
| 5,862,460 A | 1/1999 | Rich |
| 5,867,485 A | 2/1999 | Chambers et al. |
| 5,867,763 A | 2/1999 | Dean et al. |
| 5,881,200 A | 3/1999 | Burt |
| 5,883,882 A | 3/1999 | Schwartz |
| 5,896,568 A | 4/1999 | Tseng et al. |
| 5,903,834 A | 5/1999 | Wallstedt et al. |
| 5,910,776 A | 6/1999 | Black |
| 5,913,003 A | 6/1999 | Arroyo et al. |
| 5,917,636 A | 6/1999 | Wake et al. |
| 5,930,682 A | 7/1999 | Schwartz et al. |
| 5,936,754 A | 8/1999 | Ariyavisitakul et al. |
| 5,943,372 A | 8/1999 | Gans et al. |
| 5,946,622 A | 8/1999 | Bojeryd |
| 5,949,564 A | 9/1999 | Wake |
| 5,953,670 A | 9/1999 | Newson |
| 5,959,531 A | 9/1999 | Gallagher, III et al. |
| 5,960,344 A | 9/1999 | Mahany |
| 5,969,837 A | 10/1999 | Farber et al. |
| 5,983,070 A | 11/1999 | Georges et al. |
| 5,987,303 A | 11/1999 | Dutta et al. |
| 6,005,884 A | 12/1999 | Cook et al. |
| 6,006,069 A | 12/1999 | Langston et al. |
| 6,006,105 A | 12/1999 | Rostoker et al. |
| 6,011,980 A | 1/2000 | Nagano et al. |
| 6,014,546 A | 1/2000 | Georges et al. |
| 6,016,426 A | 1/2000 | Bodell |
| 6,023,625 A | 2/2000 | Myers, Jr. |
| 6,037,898 A | 3/2000 | Parish et al. |
| 6,061,161 A | 5/2000 | Yang et al. |
| 6,069,721 A | 5/2000 | Oh et al. |
| 6,084,772 A * | 7/2000 | Pell .............. H05K 7/20681 165/104.21 |
| 6,088,381 A | 7/2000 | Myers, Jr. |
| 6,118,767 A | 9/2000 | Shen et al. |
| 6,122,529 A | 9/2000 | Sabat, Jr. et al. |
| 6,127,917 A | 10/2000 | Tuttle |
| 6,128,470 A | 10/2000 | Naidu et al. |
| 6,128,477 A | 10/2000 | Freed |
| 6,148,041 A | 11/2000 | Dent |
| 6,150,921 A | 11/2000 | Werb et al. |
| 6,157,810 A | 12/2000 | Georges et al. |
| 6,192,216 B1 | 2/2001 | Sabat, Jr. et al. |
| 6,194,968 B1 | 2/2001 | Winslow |
| 6,212,397 B1 | 4/2001 | Langston et al. |
| 6,222,503 B1 | 4/2001 | Gietema |
| 6,223,201 B1 | 4/2001 | Reznak |
| 6,232,870 B1 | 5/2001 | Garber et al. |
| 6,236,789 B1 | 5/2001 | Fitz |
| 6,236,863 B1 | 5/2001 | Waldroup et al. |
| 6,240,274 B1 | 5/2001 | Izadpanah |
| 6,246,500 B1 | 6/2001 | Ackerman |
| 6,268,946 B1 | 7/2001 | Larkin et al. |
| 6,275,990 B1 | 8/2001 | Dapper et al. |
| 6,279,158 B1 | 8/2001 | Geile et al. |
| 6,286,163 B1 | 9/2001 | Trimble |
| 6,292,673 B1 | 9/2001 | Maeda et al. |
| 6,295,451 B1 | 9/2001 | Mimura |
| 6,301,240 B1 | 10/2001 | Slabinski et al. |
| 6,307,869 B1 | 10/2001 | Pawelski |
| 6,314,163 B1 | 11/2001 | Acampora |
| 6,317,599 B1 | 11/2001 | Rappaport et al. |
| 6,323,980 B1 | 11/2001 | Bloom |
| 6,324,391 B1 | 11/2001 | Bodell |
| 6,330,241 B1 | 12/2001 | Fort |
| 6,330,244 B1 | 12/2001 | Swartz et al. |
| 6,334,219 B1 | 12/2001 | Hill et al. |
| 6,336,021 B1 | 1/2002 | Nukada |
| 6,336,042 B1 | 1/2002 | Dawson et al. |
| 6,337,754 B1 | 1/2002 | Imajo |
| 6,340,932 B1 | 1/2002 | Rodgers et al. |

(56) References Cited

U.S. PATENT DOCUMENTS

| | | |
|---|---|---|
| 6,353,406 B1 | 3/2002 | Lanzl et al. |
| 6,353,600 B1 | 3/2002 | Schwartz et al. |
| 6,359,714 B1 | 3/2002 | Imajo |
| 6,370,203 B1 | 4/2002 | Boesch et al. |
| 6,374,078 B1 | 4/2002 | Williams et al. |
| 6,374,124 B1 | 4/2002 | Slabinski |
| 6,389,010 B1 | 5/2002 | Kubler et al. |
| 6,400,318 B1 | 6/2002 | Kasami et al. |
| 6,400,418 B1 | 6/2002 | Wakabayashi |
| 6,404,775 B1 | 6/2002 | Leslie et al. |
| 6,405,018 B1 | 6/2002 | Reudink et al. |
| 6,405,058 B2 | 6/2002 | Bobier |
| 6,405,308 B1 | 6/2002 | Gupta et al. |
| 6,414,624 B2 | 7/2002 | Endo et al. |
| 6,415,132 B1 | 7/2002 | Sabat, Jr. |
| 6,421,327 B1 | 7/2002 | Lundby et al. |
| 6,438,301 B1 | 8/2002 | Johnson et al. |
| 6,438,371 B1 | 8/2002 | Fujise et al. |
| 6,448,558 B1 | 9/2002 | Greene |
| 6,452,915 B1 | 9/2002 | Jorgensen |
| 6,459,519 B1 | 10/2002 | Sasai et al. |
| 6,459,989 B1 | 10/2002 | Kirkpatrick et al. |
| 6,477,154 B1 | 11/2002 | Cheong et al. |
| 6,480,702 B1 | 11/2002 | Sabat, Jr. |
| 6,486,907 B1 | 11/2002 | Farber et al. |
| 6,496,290 B1 | 12/2002 | Lee |
| 6,501,965 B1 | 12/2002 | Lucidarme |
| 6,504,636 B1 | 1/2003 | Seto et al. |
| 6,504,831 B1 | 1/2003 | Greenwood et al. |
| 6,512,478 B1 | 1/2003 | Chien |
| 6,519,395 B1 | 2/2003 | Bevan et al. |
| 6,519,449 B1 | 2/2003 | Zhang et al. |
| 6,525,855 B1 | 2/2003 | Westbrook et al. |
| 6,535,330 B1 | 3/2003 | Lelic et al. |
| 6,535,720 B1 | 3/2003 | Kintis et al. |
| 6,556,551 B1 | 4/2003 | Schwartz |
| 6,577,794 B1 | 6/2003 | Currie et al. |
| 6,577,801 B2 | 6/2003 | Broderick et al. |
| 6,580,402 B2 | 6/2003 | Navarro et al. |
| 6,580,905 B1 | 6/2003 | Naidu et al. |
| 6,580,918 B1 | 6/2003 | Leickel et al. |
| 6,583,763 B2 | 6/2003 | Judd |
| 6,587,514 B1 | 7/2003 | Wright et al. |
| 6,594,496 B2 | 7/2003 | Schwartz |
| 6,597,325 B2 | 7/2003 | Judd et al. |
| 6,598,009 B2 | 7/2003 | Yang |
| 6,606,430 B2 | 8/2003 | Bartur et al. |
| 6,615,074 B2 | 9/2003 | Mickle et al. |
| 6,628,732 B1 | 9/2003 | Takaki |
| 6,634,811 B1 | 10/2003 | Gertel et al. |
| 6,636,747 B2 | 10/2003 | Harada et al. |
| 6,640,103 B1 | 10/2003 | Inman et al. |
| 6,643,437 B1 | 11/2003 | Park |
| 6,652,158 B2 | 11/2003 | Bartur et al. |
| 6,654,590 B2 | 11/2003 | Boros et al. |
| 6,654,616 B1 | 11/2003 | Pope, Jr. et al. |
| 6,657,535 B1 | 12/2003 | Magbie et al. |
| 6,658,269 B1 | 12/2003 | Golemon et al. |
| 6,665,308 B1 | 12/2003 | Rakib et al. |
| 6,670,930 B2 | 12/2003 | Navarro |
| 6,674,966 B1 | 1/2004 | Koonen |
| 6,675,294 B1 | 1/2004 | Gupta et al. |
| 6,678,509 B2 | 1/2004 | Skarman et al. |
| 6,687,437 B1 | 2/2004 | Starnes et al. |
| 6,690,328 B2 | 2/2004 | Judd |
| 6,701,137 B1 | 3/2004 | Judd et al. |
| 6,704,298 B1 | 3/2004 | Matsumiya et al. |
| 6,704,545 B1 | 3/2004 | Wala |
| 6,710,366 B1 | 3/2004 | Lee et al. |
| 6,714,800 B2 | 3/2004 | Johnson et al. |
| 6,731,880 B2 | 5/2004 | Westbrook et al. |
| 6,745,013 B1 | 6/2004 | Porter et al. |
| 6,758,913 B1 | 7/2004 | Tunney et al. |
| 6,763,226 B1 | 7/2004 | McZeal, Jr. |
| 6,771,862 B2 | 8/2004 | Karnik et al. |
| 6,771,933 B1 | 8/2004 | Eng et al. |
| 6,784,802 B1 | 8/2004 | Stanescu |
| 6,785,558 B1 | 8/2004 | Stratford et al. |
| 6,788,666 B1 | 9/2004 | Linebarger et al. |
| 6,801,767 B1 | 10/2004 | Schwartz et al. |
| 6,807,374 B1 | 10/2004 | Imajo et al. |
| 6,812,824 B1 | 11/2004 | Goldinger et al. |
| 6,812,905 B2 | 11/2004 | Thomas et al. |
| 6,823,174 B1 | 11/2004 | Masenten et al. |
| 6,826,163 B2 | 11/2004 | Mani et al. |
| 6,826,164 B2 | 11/2004 | Mani et al. |
| 6,826,337 B2 | 11/2004 | Linnell |
| 6,836,660 B1 | 12/2004 | Wala |
| 6,836,673 B1 | 12/2004 | Trott |
| 6,842,433 B2 | 1/2005 | West et al. |
| 6,847,856 B1 | 1/2005 | Bohannon |
| 6,850,510 B2 | 2/2005 | Kubler |
| 6,865,390 B2 | 3/2005 | Goss et al. |
| 6,873,823 B2 | 3/2005 | Hasarchi |
| 6,876,056 B2 | 4/2005 | Tilmans et al. |
| 6,879,290 B1 | 4/2005 | Toutain et al. |
| 6,882,311 B2 | 4/2005 | Walker et al. |
| 6,883,710 B2 | 4/2005 | Chung |
| 6,885,344 B2 | 4/2005 | Mohamadi |
| 6,885,846 B1 | 4/2005 | Panasik et al. |
| 6,889,060 B2 | 5/2005 | Fernando et al. |
| 6,909,399 B1 | 6/2005 | Zegelin et al. |
| 6,915,058 B2 | 7/2005 | Pons |
| 6,915,529 B1 | 7/2005 | Suematsu et al. |
| 6,919,858 B2 | 7/2005 | Rofougaran |
| 6,920,330 B2 | 7/2005 | Caronni et al. |
| 6,924,997 B2 | 8/2005 | Chen et al. |
| 6,930,987 B1 | 8/2005 | Fukuda et al. |
| 6,931,183 B2 | 8/2005 | Panak et al. |
| 6,931,659 B1 | 8/2005 | Kinemura |
| 6,933,849 B2 | 8/2005 | Sawyer |
| 6,934,511 B1 | 8/2005 | Lovinggood et al. |
| 6,934,541 B2 | 8/2005 | Miyatani |
| 6,941,112 B2 | 9/2005 | Hasegawa |
| 6,946,989 B2 | 9/2005 | Vavik |
| 6,961,312 B2 | 11/2005 | Kubler et al. |
| 6,963,289 B2 | 11/2005 | Aljadeff et al. |
| 6,963,552 B2 | 11/2005 | Sabat, Jr. et al. |
| 6,965,718 B2 | 11/2005 | Koertel |
| 6,967,347 B2 | 11/2005 | Estes et al. |
| 6,968,107 B2 | 11/2005 | Belardi et al. |
| 6,970,652 B2 | 11/2005 | Zhang et al. |
| 6,973,243 B2 | 12/2005 | Koyasu et al. |
| 6,974,262 B1 | 12/2005 | Rickenbach |
| 6,977,502 B1 | 12/2005 | Hertz |
| 7,002,511 B1 | 2/2006 | Ammar et al. |
| 7,006,465 B2 | 2/2006 | Toshimitsu et al. |
| 7,013,087 B2 | 3/2006 | Suzuki et al. |
| 7,015,826 B1 | 3/2006 | Chan et al. |
| 7,020,473 B2 | 3/2006 | Splett |
| 7,020,488 B1 | 3/2006 | Bleile et al. |
| 7,024,166 B2 | 4/2006 | Wallace |
| 7,035,512 B2 | 4/2006 | Van Bijsterveld |
| 7,039,399 B2 | 5/2006 | Fischer |
| 7,043,271 B1 | 5/2006 | Seto et al. |
| 7,047,028 B2 | 5/2006 | Cagenius et al. |
| 7,050,017 B2 | 5/2006 | King et al. |
| 7,053,838 B2 | 5/2006 | Judd |
| 7,054,513 B2 | 5/2006 | Herz et al. |
| 7,069,577 B2 | 6/2006 | Geile et al. |
| 7,072,586 B2 | 7/2006 | Aburakawa et al. |
| 7,082,320 B2 | 7/2006 | Kattukaran et al. |
| 7,084,769 B2 | 8/2006 | Bauer et al. |
| 7,093,985 B2 | 8/2006 | Lord et al. |
| 7,103,119 B2 | 9/2006 | Matsuoka et al. |
| 7,103,377 B2 | 9/2006 | Bauman et al. |
| 7,106,252 B2 | 9/2006 | Smith et al. |
| 7,106,931 B2 | 9/2006 | Sutehall et al. |
| 7,110,795 B2 | 9/2006 | Doi |
| 7,114,859 B1 | 10/2006 | Tuohimaa et al. |
| 7,127,175 B2 | 10/2006 | Mani et al. |
| 7,127,176 B2 | 10/2006 | Sasaki |
| 7,142,503 B1 | 11/2006 | Grant et al. |
| 7,142,535 B2 | 11/2006 | Kubler et al. |

(56) References Cited

U.S. PATENT DOCUMENTS

| | | | |
|---|---|---|---|
| 7,142,619 | B2 | 11/2006 | Sommer et al. |
| 7,146,506 | B1 | 12/2006 | Hannah et al. |
| 7,160,032 | B2 | 1/2007 | Nagashima et al. |
| 7,171,244 | B2 | 1/2007 | Bauman |
| 7,184,728 | B2 | 2/2007 | Solum |
| 7,190,748 | B2 | 3/2007 | Kim et al. |
| 7,194,023 | B2 | 3/2007 | Norrell et al. |
| 7,199,443 | B2 | 4/2007 | Elsharawy |
| 7,200,305 | B2 | 4/2007 | Dion et al. |
| 7,200,391 | B2 | 4/2007 | Chung et al. |
| 7,228,072 | B2 | 6/2007 | Mickelsson et al. |
| 7,263,293 | B2 | 8/2007 | Ommodt et al. |
| 7,269,311 | B2 | 9/2007 | Kim et al. |
| 7,280,011 | B2 | 10/2007 | Bayar et al. |
| 7,286,843 | B2 | 10/2007 | Scheck |
| 7,286,854 | B2 | 10/2007 | Ferrato et al. |
| 7,295,119 | B2 | 11/2007 | Rappaport et al. |
| 7,310,430 | B1 | 12/2007 | Mallya et al. |
| 7,313,415 | B2 | 12/2007 | Wake et al. |
| 7,315,735 | B2 | 1/2008 | Graham |
| 7,324,730 | B2 | 1/2008 | Varkey et al. |
| 7,343,164 | B2 | 3/2008 | Kallstenius |
| 7,348,843 | B1 | 3/2008 | Qiu et al. |
| 7,349,633 | B2 | 3/2008 | Lee et al. |
| 7,359,408 | B2 | 4/2008 | Kim |
| 7,359,674 | B2 | 4/2008 | Markki et al. |
| 7,366,150 | B2 | 4/2008 | Lee et al. |
| 7,366,151 | B2 | 4/2008 | Kubler et al. |
| 7,369,526 | B2 | 5/2008 | Lechleider et al. |
| 7,379,669 | B2 | 5/2008 | Kim |
| 7,388,892 | B2 | 6/2008 | Nishiyama et al. |
| 7,392,025 | B2 | 6/2008 | Rooyen et al. |
| 7,392,029 | B2 | 6/2008 | Pronkine |
| 7,394,883 | B2 | 7/2008 | Funakubo et al. |
| 7,403,156 | B2 | 7/2008 | Coppi et al. |
| 7,409,159 | B2 | 8/2008 | Izadpanah |
| 7,412,224 | B2 | 8/2008 | Kotola et al. |
| 7,424,228 | B1 | 9/2008 | Williams et al. |
| 7,444,051 | B2 | 10/2008 | Tatat et al. |
| 7,450,853 | B2 | 11/2008 | Kim et al. |
| 7,450,854 | B2 | 11/2008 | Lee et al. |
| 7,451,365 | B2 | 11/2008 | Wang et al. |
| 7,454,222 | B2 | 11/2008 | Huang et al. |
| 7,460,507 | B2 | 12/2008 | Kubler et al. |
| 7,460,829 | B2 | 12/2008 | Utsumi et al. |
| 7,460,831 | B2 | 12/2008 | Hasarchi |
| 7,466,925 | B2 | 12/2008 | Iannelli |
| 7,469,105 | B2 | 12/2008 | Wake et al. |
| 7,477,597 | B2 | 1/2009 | Segel |
| 7,483,504 | B2 | 1/2009 | Shapira et al. |
| 7,483,711 | B2 | 1/2009 | Burchfiel |
| 7,496,070 | B2 | 2/2009 | Vesuna |
| 7,496,384 | B2 | 2/2009 | Seto et al. |
| 7,505,747 | B2 | 3/2009 | Solum |
| 7,512,419 | B2 | 3/2009 | Solum |
| 7,514,804 | B2 * | 4/2009 | Wang ................ G06K 7/0008 290/1 A |
| 7,522,552 | B2 | 4/2009 | Fein et al. |
| 7,539,509 | B2 | 5/2009 | Bauman et al. |
| 7,542,452 | B2 | 6/2009 | Penumetsa |
| 7,546,138 | B2 | 6/2009 | Bauman |
| 7,548,138 | B2 | 6/2009 | Kamgaing |
| 7,548,695 | B2 | 6/2009 | Wake |
| 7,551,641 | B2 | 6/2009 | Pirzada et al. |
| 7,557,758 | B2 | 7/2009 | Rofougaran |
| 7,580,384 | B2 | 8/2009 | Kubler et al. |
| 7,586,861 | B2 | 9/2009 | Kubler et al. |
| 7,590,354 | B2 | 9/2009 | Sauer et al. |
| 7,593,704 | B2 | 9/2009 | Pinel et al. |
| 7,599,420 | B2 | 10/2009 | Forenza et al. |
| 7,599,672 | B2 | 10/2009 | Shoji et al. |
| 7,610,046 | B2 | 10/2009 | Wala |
| 7,630,690 | B2 | 12/2009 | Kaewell, Jr. et al. |
| 7,633,934 | B2 | 12/2009 | Kubler et al. |
| 7,639,982 | B2 | 12/2009 | Wala |
| 7,646,743 | B2 | 1/2010 | Kubler et al. |
| 7,646,777 | B2 | 1/2010 | Hicks, III et al. |
| 7,653,397 | B2 | 1/2010 | Pernu et al. |
| 7,668,565 | B2 | 2/2010 | Ylänen et al. |
| 7,675,936 | B2 | 3/2010 | Mizutani et al. |
| 7,688,811 | B2 | 3/2010 | Kubler et al. |
| 7,693,486 | B2 | 4/2010 | Kasslin et al. |
| 7,697,467 | B2 | 4/2010 | Kubler et al. |
| 7,697,574 | B2 | 4/2010 | Suematsu et al. |
| 7,706,803 | B2 * | 4/2010 | Benco ................ H04W 16/26 370/331 |
| 7,715,375 | B2 | 5/2010 | Kubler et al. |
| 7,720,510 | B2 | 5/2010 | Pescod et al. |
| 7,751,374 | B2 | 7/2010 | Donovan |
| 7,751,838 | B2 | 7/2010 | Ramesh et al. |
| 7,760,703 | B2 | 7/2010 | Kubler et al. |
| 7,761,093 | B2 | 7/2010 | Sabat, Jr. et al. |
| 7,768,951 | B2 | 8/2010 | Kubler et al. |
| 7,773,573 | B2 | 8/2010 | Chung et al. |
| 7,778,603 | B2 | 8/2010 | Palin et al. |
| 7,787,823 | B2 | 8/2010 | George et al. |
| 7,805,073 | B2 | 9/2010 | Sabat, Jr. et al. |
| 7,809,012 | B2 | 10/2010 | Ruuska et al. |
| 7,812,766 | B2 | 10/2010 | Leblanc et al. |
| 7,812,775 | B2 | 10/2010 | Babakhani et al. |
| 7,817,969 | B2 | 10/2010 | Castaneda et al. |
| 7,835,328 | B2 | 11/2010 | Stephens et al. |
| 7,848,316 | B2 | 12/2010 | Kubler et al. |
| 7,848,770 | B2 | 12/2010 | Scheinert |
| 7,853,234 | B2 | 12/2010 | Afsahi |
| 7,870,321 | B2 | 1/2011 | Rofougaran |
| 7,880,677 | B2 | 2/2011 | Rofougaran et al. |
| 7,881,755 | B1 | 2/2011 | Mishra et al. |
| 7,894,423 | B2 | 2/2011 | Kubler et al. |
| 7,899,007 | B2 | 3/2011 | Kubler et al. |
| 7,907,972 | B2 | 3/2011 | Walton et al. |
| 7,912,043 | B2 | 3/2011 | Kubler et al. |
| 7,912,506 | B2 | 3/2011 | Lovberg et al. |
| 7,916,706 | B2 | 3/2011 | Kubler et al. |
| 7,917,177 | B2 | 3/2011 | Bauman |
| 7,920,553 | B2 | 4/2011 | Kubler et al. |
| 7,920,858 | B2 | 4/2011 | Sabat, Jr. et al. |
| 7,924,783 | B1 | 4/2011 | Mahany et al. |
| 7,936,713 | B2 | 5/2011 | Kubler et al. |
| 7,949,364 | B2 | 5/2011 | Kasslin et al. |
| 7,957,777 | B1 | 6/2011 | Vu et al. |
| 7,962,111 | B2 | 6/2011 | Solum |
| 7,969,009 | B2 | 6/2011 | Chandrasekaran |
| 7,969,911 | B2 | 6/2011 | Mahany et al. |
| 7,990,925 | B2 | 8/2011 | Tinnakornsrisuphap et al. |
| 7,996,020 | B1 | 8/2011 | Chhabra |
| 8,018,907 | B2 | 9/2011 | Kubler et al. |
| 8,023,886 | B2 | 9/2011 | Rofougaran |
| 8,027,656 | B2 | 9/2011 | Rofougaran et al. |
| 8,036,308 | B2 | 10/2011 | Rofougaran |
| 8,082,353 | B2 | 12/2011 | Huber et al. |
| 8,086,192 | B2 | 12/2011 | Rofougaran et al. |
| 8,135,102 | B2 | 3/2012 | Wiwel et al. |
| 8,213,401 | B2 | 7/2012 | Fischer et al. |
| 8,223,795 | B2 | 7/2012 | Cox et al. |
| 8,235,349 | B1 | 8/2012 | Conklin et al. ................ 248/553 |
| 8,238,463 | B1 | 8/2012 | Arslan et al. |
| 8,270,387 | B2 | 9/2012 | Cannon et al. |
| 8,290,483 | B2 | 10/2012 | Sabat, Jr. et al. |
| 8,306,563 | B2 | 11/2012 | Zavadsky et al. |
| 8,346,278 | B2 | 1/2013 | Wala et al. |
| 8,385,850 | B1 | 2/2013 | Thompson et al. ......... 455/90.3 |
| 8,428,201 | B1 | 4/2013 | McHann, Jr. et al. |
| 8,428,510 | B2 | 4/2013 | Stratford et al. |
| 8,462,683 | B2 | 6/2013 | Uyehara et al. |
| 8,472,579 | B2 | 6/2013 | Uyehara et al. |
| 8,509,215 | B2 | 8/2013 | Stuart |
| 8,509,850 | B2 | 8/2013 | Zavadsky et al. |
| 8,526,970 | B2 | 9/2013 | Wala et al. |
| 8,532,242 | B2 | 9/2013 | Fischer et al. |
| 8,626,245 | B2 | 1/2014 | Zavadsky et al. |
| 8,737,454 | B2 | 5/2014 | Wala et al. |
| 8,743,718 | B2 | 6/2014 | Grenier et al. |
| 8,743,756 | B2 | 6/2014 | Uyehara et al. |

(56) References Cited

U.S. PATENT DOCUMENTS

| | | |
|---|---|---|
| 8,837,659 B2 | 9/2014 | Uyehara et al. |
| 8,837,940 B2 | 9/2014 | Smith et al. |
| 8,873,585 B2 | 10/2014 | Oren et al. |
| 8,929,288 B2 | 1/2015 | Stewart et al. |
| 2001/0036163 A1 | 11/2001 | Sabat, Jr. et al. |
| 2001/0036199 A1 | 11/2001 | Terry |
| 2002/0003645 A1 | 1/2002 | Kim et al. |
| 2002/0009070 A1 | 1/2002 | Lindsay et al. |
| 2002/0012336 A1 | 1/2002 | Hughes et al. |
| 2002/0012495 A1 | 1/2002 | Sasai et al. |
| 2002/0016827 A1 | 2/2002 | McCabe et al. |
| 2002/0045519 A1 | 4/2002 | Watterson et al. |
| 2002/0048071 A1 | 4/2002 | Suzuki et al. |
| 2002/0051434 A1 | 5/2002 | Ozluturk et al. |
| 2002/0075906 A1 | 6/2002 | Cole et al. |
| 2002/0092347 A1 | 7/2002 | Niekerk et al. |
| 2002/0097564 A1 | 7/2002 | Struhsaker et al. |
| 2002/0103012 A1 | 8/2002 | Kim et al. |
| 2002/0111149 A1 | 8/2002 | Shoki |
| 2002/0111192 A1 | 8/2002 | Thomas et al. |
| 2002/0114038 A1 | 8/2002 | Arnon et al. |
| 2002/0123365 A1 | 9/2002 | Thorson et al. |
| 2002/0126967 A1 | 9/2002 | Panak et al. |
| 2002/0128009 A1 | 9/2002 | Boch et al. |
| 2002/0130778 A1 | 9/2002 | Nicholson |
| 2002/0181668 A1 | 12/2002 | Masoian et al. |
| 2002/0190845 A1 | 12/2002 | Moore |
| 2002/0197984 A1 | 12/2002 | Monin et al. |
| 2003/0002604 A1 | 1/2003 | Fifield et al. |
| 2003/0007214 A1 | 1/2003 | Aburakawa et al. |
| 2003/0016418 A1 | 1/2003 | Westbrook et al. |
| 2003/0045284 A1 | 3/2003 | Copley et al. |
| 2003/0069922 A1 | 4/2003 | Arunachalam |
| 2003/0078074 A1 | 4/2003 | Sesay et al. |
| 2003/0112826 A1 | 6/2003 | Ashwood Smith et al. |
| 2003/0141962 A1 | 7/2003 | Barink |
| 2003/0161637 A1 | 8/2003 | Yamamoto et al. |
| 2003/0165287 A1 | 9/2003 | Krill et al. |
| 2003/0174099 A1 | 9/2003 | Bauer et al. |
| 2003/0209601 A1 | 11/2003 | Chung |
| 2004/0001719 A1 | 1/2004 | Sasaki |
| 2004/0008114 A1 | 1/2004 | Sawyer |
| 2004/0017785 A1 | 1/2004 | Zelst |
| 2004/0037565 A1 | 2/2004 | Young et al. |
| 2004/0041714 A1 | 3/2004 | Forster |
| 2004/0043764 A1 | 3/2004 | Bigham et al. |
| 2004/0047313 A1 | 3/2004 | Rumpf et al. |
| 2004/0078151 A1 | 4/2004 | Aljadeff et al. |
| 2004/0095907 A1 | 5/2004 | Agee et al. |
| 2004/0100930 A1 | 5/2004 | Shapira et al. |
| 2004/0106435 A1 | 6/2004 | Bauman et al. |
| 2004/0126068 A1 | 7/2004 | Van Bijsterveld |
| 2004/0126107 A1 | 7/2004 | Jay et al. |
| 2004/0139477 A1 | 7/2004 | Russell et al. |
| 2004/0146020 A1 | 7/2004 | Kubler et al. |
| 2004/0149736 A1 | 8/2004 | Clothier |
| 2004/0151164 A1 | 8/2004 | Kubler et al. |
| 2004/0151503 A1 | 8/2004 | Kashima et al. |
| 2004/0157623 A1 | 8/2004 | Splett |
| 2004/0160912 A1 | 8/2004 | Kubler et al. |
| 2004/0160913 A1 | 8/2004 | Kubler et al. |
| 2004/0162084 A1 | 8/2004 | Wang |
| 2004/0162115 A1 | 8/2004 | Smith et al. |
| 2004/0162116 A1 | 8/2004 | Han et al. |
| 2004/0165573 A1 | 8/2004 | Kubler et al. |
| 2004/0175173 A1 | 9/2004 | Deas |
| 2004/0196404 A1 | 10/2004 | Loheit et al. |
| 2004/0202257 A1 | 10/2004 | Mehta et al. |
| 2004/0203703 A1 | 10/2004 | Fischer |
| 2004/0203704 A1 | 10/2004 | Ommodt et al. |
| 2004/0203846 A1 | 10/2004 | Caronni et al. |
| 2004/0204109 A1 | 10/2004 | Hoppenstein |
| 2004/0208526 A1 | 10/2004 | Mibu |
| 2004/0208643 A1 | 10/2004 | Roberts et al. |
| 2004/0215723 A1 | 10/2004 | Chadha |
| 2004/0218873 A1 | 11/2004 | Nagashima et al. |
| 2004/0233877 A1 | 11/2004 | Lee et al. |
| 2004/0258105 A1 | 12/2004 | Spathas et al. |
| 2004/0267971 A1 | 12/2004 | Seshadri |
| 2005/0052287 A1 | 3/2005 | Whitesmith et al. |
| 2005/0058451 A1 | 3/2005 | Ross |
| 2005/0068179 A1 | 3/2005 | Roesner |
| 2005/0076982 A1 | 4/2005 | Metcalf et al. |
| 2005/0078006 A1 | 4/2005 | Hutchins |
| 2005/0093679 A1 | 5/2005 | Zai et al. |
| 2005/0099343 A1 | 5/2005 | Asrani et al. |
| 2005/0116821 A1 | 6/2005 | Wilsey et al. |
| 2005/0123232 A1 | 6/2005 | Piede et al. |
| 2005/0141545 A1 | 6/2005 | Fein et al. |
| 2005/0143077 A1 | 6/2005 | Charbonneau |
| 2005/0147067 A1 | 7/2005 | Mani et al. |
| 2005/0147071 A1 | 7/2005 | Karaoguz et al. |
| 2005/0148306 A1 | 7/2005 | Hiddink |
| 2005/0159108 A1 | 7/2005 | Fletcher |
| 2005/0174236 A1 | 8/2005 | Brookner |
| 2005/0176458 A1 | 8/2005 | Shklarsky et al. |
| 2005/0201323 A1 | 9/2005 | Mani et al. |
| 2005/0201761 A1 | 9/2005 | Bartur et al. |
| 2005/0219050 A1 | 10/2005 | Martin |
| 2005/0224585 A1 | 10/2005 | Durrant et al. |
| 2005/0226625 A1 | 10/2005 | Wake et al. |
| 2005/0232636 A1 | 10/2005 | Durrant et al. |
| 2005/0242188 A1 | 11/2005 | Vesuna |
| 2005/0252971 A1 | 11/2005 | Howarth et al. |
| 2005/0266797 A1 | 12/2005 | Utsumi et al. |
| 2005/0266854 A1 | 12/2005 | Niiho et al. |
| 2005/0269930 A1 | 12/2005 | Shimizu et al. |
| 2005/0271396 A1 | 12/2005 | Iannelli |
| 2005/0272439 A1 | 12/2005 | Picciriello et al. |
| 2006/0002326 A1 | 1/2006 | Vesuna |
| 2006/0014548 A1 | 1/2006 | Bolin |
| 2006/0017633 A1 | 1/2006 | Pronkine |
| 2006/0028352 A1 | 2/2006 | McNamara et al. |
| 2006/0045054 A1 | 3/2006 | Utsumi et al. |
| 2006/0045524 A1 | 3/2006 | Lee et al. |
| 2006/0045525 A1 | 3/2006 | Lee et al. |
| 2006/0053324 A1 | 3/2006 | Giat et al. |
| 2006/0056327 A1 | 3/2006 | Coersmeier |
| 2006/0062579 A1 | 3/2006 | Kim et al. |
| 2006/0083520 A1 | 4/2006 | Healey et al. |
| 2006/0094470 A1 | 5/2006 | Wake et al. |
| 2006/0104643 A1 | 5/2006 | Lee et al. |
| 2006/0159388 A1 | 7/2006 | Kawase et al. |
| 2006/0172775 A1 | 8/2006 | Conyers et al. |
| 2006/0182446 A1 | 8/2006 | Kim et al. |
| 2006/0182449 A1 | 8/2006 | Iannelli et al. |
| 2006/0189354 A1 | 8/2006 | Lee et al. |
| 2006/0209745 A1 | 9/2006 | MacMullan et al. |
| 2006/0223439 A1 | 10/2006 | Pinel et al. |
| 2006/0233506 A1 | 10/2006 | Noonan et al. |
| 2006/0239630 A1 | 10/2006 | Hase et al. |
| 2006/0268738 A1 | 11/2006 | Goerke et al. |
| 2006/0274704 A1 | 12/2006 | Desai et al. |
| 2007/0009266 A1 | 1/2007 | Bothwell |
| 2007/0050451 A1 | 3/2007 | Caspi et al. |
| 2007/0054682 A1 | 3/2007 | Fanning et al. |
| 2007/0058978 A1 | 3/2007 | Lee et al. |
| 2007/0060045 A1 | 3/2007 | Prautzsch |
| 2007/0060055 A1 | 3/2007 | Desai et al. |
| 2007/0071128 A1 | 3/2007 | Meir et al. |
| 2007/0076649 A1 | 4/2007 | Lin et al. |
| 2007/0093273 A1 | 4/2007 | Cai |
| 2007/0149250 A1 | 6/2007 | Crozzoli et al. |
| 2007/0166042 A1 | 7/2007 | Seeds et al. |
| 2007/0173288 A1 | 7/2007 | Skarby et al. |
| 2007/0174889 A1 | 7/2007 | Kim et al. |
| 2007/0224954 A1 | 9/2007 | Gopi |
| 2007/0230328 A1 | 10/2007 | Saitou |
| 2007/0243899 A1 | 10/2007 | Hermel et al. |
| 2007/0248358 A1 | 10/2007 | Sauer |
| 2007/0253714 A1 | 11/2007 | Seeds et al. |
| 2007/0257796 A1 | 11/2007 | Easton et al. |
| 2007/0264009 A1 | 11/2007 | Sabat, Jr. et al. |
| 2007/0264011 A1 | 11/2007 | Sone et al. |

(56) References Cited

U.S. PATENT DOCUMENTS

| | | |
|---|---|---|
| 2007/0268846 A1 | 11/2007 | Proctor et al. |
| 2007/0274279 A1 | 11/2007 | Wood et al. |
| 2007/0292143 A1 | 12/2007 | Yu et al. |
| 2007/0297005 A1 | 12/2007 | Montierth et al. |
| 2008/0002652 A1 | 1/2008 | Gupta et al. |
| 2008/0007453 A1 | 1/2008 | Vassilakis et al. |
| 2008/0013909 A1 | 1/2008 | Kostet et al. |
| 2008/0013956 A1 | 1/2008 | Ware et al. |
| 2008/0013957 A1 | 1/2008 | Akers et al. |
| 2008/0014948 A1 | 1/2008 | Scheinert |
| 2008/0026765 A1 | 1/2008 | Charbonneau |
| 2008/0031628 A1 | 2/2008 | Dragas et al. |
| 2008/0043714 A1 | 2/2008 | Pernu |
| 2008/0056167 A1 | 3/2008 | Kim et al. |
| 2008/0058018 A1 | 3/2008 | Scheinert |
| 2008/0063397 A1 | 3/2008 | Hu et al. |
| 2008/0070502 A1 | 3/2008 | George et al. |
| 2008/0080863 A1 | 4/2008 | Sauer et al. |
| 2008/0098203 A1 | 4/2008 | Master et al. |
| 2008/0118014 A1 | 5/2008 | Reunamaki et al. |
| 2008/0119198 A1 | 5/2008 | Hettstedt et al. |
| 2008/0124086 A1 | 5/2008 | Matthews |
| 2008/0124087 A1 | 5/2008 | Hartmann et al. |
| 2008/0129634 A1 | 6/2008 | Pera et al. |
| 2008/0134194 A1 | 6/2008 | Liu |
| 2008/0145061 A1 | 6/2008 | Lee et al. |
| 2008/0150514 A1 | 6/2008 | Codreanu et al. |
| 2008/0166094 A1 | 7/2008 | Bookbinder et al. |
| 2008/0194226 A1 | 8/2008 | Rivas et al. |
| 2008/0207253 A1 | 8/2008 | Jaakkola et al. |
| 2008/0212969 A1 | 9/2008 | Fasshauer et al. |
| 2008/0219670 A1 | 9/2008 | Kim et al. |
| 2008/0232305 A1 | 9/2008 | Oren et al. |
| 2008/0232799 A1 | 9/2008 | Kim |
| 2008/0247716 A1 | 10/2008 | Thomas et al. |
| 2008/0253280 A1 | 10/2008 | Tang et al. |
| 2008/0253351 A1 | 10/2008 | Pernu et al. |
| 2008/0253773 A1 | 10/2008 | Zheng |
| 2008/0260388 A1 | 10/2008 | Kim et al. |
| 2008/0261656 A1 | 10/2008 | Bella et al. |
| 2008/0268766 A1 | 10/2008 | Narkmon et al. |
| 2008/0268833 A1 | 10/2008 | Huang et al. |
| 2008/0273844 A1 | 11/2008 | Kewitsch |
| 2008/0279137 A1 | 11/2008 | Pernu et al. |
| 2008/0280569 A1 | 11/2008 | Hazani et al. |
| 2008/0291830 A1 | 11/2008 | Pernu et al. |
| 2008/0292322 A1 | 11/2008 | Daghighian et al. |
| 2008/0298813 A1 | 12/2008 | Song et al. |
| 2008/0304831 A1 | 12/2008 | Miller, II et al. |
| 2008/0310464 A1 | 12/2008 | Schneider |
| 2008/0310848 A1 | 12/2008 | Yasuda et al. |
| 2008/0311876 A1 | 12/2008 | Leenaerts et al. |
| 2008/0311944 A1 | 12/2008 | Hansen et al. |
| 2009/0022304 A1 | 1/2009 | Kubler et al. |
| 2009/0028087 A1 | 1/2009 | Nguyen et al. |
| 2009/0028317 A1 | 1/2009 | Ling et al. |
| 2009/0041413 A1 | 2/2009 | Hurley |
| 2009/0047023 A1 | 2/2009 | Pescod et al. |
| 2009/0059903 A1 | 3/2009 | Kubler et al. |
| 2009/0061796 A1 | 3/2009 | Arkko et al. |
| 2009/0061939 A1 | 3/2009 | Andersson et al. |
| 2009/0073916 A1 | 3/2009 | Zhang et al. |
| 2009/0081985 A1 | 3/2009 | Rofougaran et al. |
| 2009/0087179 A1 | 4/2009 | Underwood et al. |
| 2009/0088071 A1 | 4/2009 | Rofougaran |
| 2009/0088072 A1 | 4/2009 | Rofougaran et al. |
| 2009/0135078 A1 | 5/2009 | Lindmark et al. |
| 2009/0141780 A1 | 6/2009 | Cruz-Albrecht et al. |
| 2009/0149221 A1 | 6/2009 | Liu et al. |
| 2009/0154621 A1 | 6/2009 | Shapira et al. |
| 2009/0169163 A1 | 7/2009 | Abbott, III et al. |
| 2009/0175214 A1 | 7/2009 | Sfar et al. |
| 2009/0180407 A1 | 7/2009 | Sabat et al. |
| 2009/0180426 A1 | 7/2009 | Sabat et al. |
| 2009/0218407 A1 | 9/2009 | Rofougaran |
| 2009/0218657 A1 | 9/2009 | Rofougaran |
| 2009/0237317 A1 | 9/2009 | Rofougaran |
| 2009/0245084 A1 | 10/2009 | Moffatt et al. |
| 2009/0245153 A1 | 10/2009 | Li et al. |
| 2009/0245221 A1 | 10/2009 | Piipponen |
| 2009/0247109 A1 | 10/2009 | Rofougaran |
| 2009/0252136 A1 | 10/2009 | Mahany et al. |
| 2009/0252139 A1 | 10/2009 | Ludovico et al. |
| 2009/0252205 A1 | 10/2009 | Rheinfelder et al. |
| 2009/0258652 A1 | 10/2009 | Lambert et al. |
| 2009/0278596 A1 | 11/2009 | Rofougaran et al. |
| 2009/0279593 A1 | 11/2009 | Rofougaran et al. |
| 2009/0285147 A1 | 11/2009 | Subasic et al. |
| 2009/0316608 A1 | 12/2009 | Singh et al. |
| 2009/0319909 A1 | 12/2009 | Hsueh et al. |
| 2010/0002626 A1 | 1/2010 | Schmidt et al. |
| 2010/0002661 A1 | 1/2010 | Schmidt et al. |
| 2010/0002662 A1 | 1/2010 | Schmidt et al. |
| 2010/0014494 A1 | 1/2010 | Schmidt et al. |
| 2010/0027443 A1 | 2/2010 | LoGalbo et al. |
| 2010/0056200 A1 | 3/2010 | Tolonen |
| 2010/0080154 A1 | 4/2010 | Noh et al. |
| 2010/0080182 A1 | 4/2010 | Kubler et al. |
| 2010/0091475 A1 | 4/2010 | Toms et al. |
| 2010/0118864 A1 | 5/2010 | Kubler et al. |
| 2010/0127937 A1 | 5/2010 | Chandrasekaran et al. |
| 2010/0134257 A1 | 6/2010 | Puleston et al. |
| 2010/0142598 A1 | 6/2010 | Murray et al. |
| 2010/0142955 A1 | 6/2010 | Yu et al. |
| 2010/0144285 A1 | 6/2010 | Behzad et al. |
| 2010/0148373 A1 | 6/2010 | Chandrasekaran |
| 2010/0156721 A1 | 6/2010 | Alamouti et al. |
| 2010/0159859 A1 | 6/2010 | Rofougaran |
| 2010/0188998 A1 | 7/2010 | Pernu et al. |
| 2010/0189439 A1 | 7/2010 | Novak et al. |
| 2010/0190509 A1 | 7/2010 | Davis |
| 2010/0202326 A1 | 8/2010 | Rofougaran et al. |
| 2010/0225413 A1 | 9/2010 | Rofougaran et al. |
| 2010/0225520 A1 | 9/2010 | Mohamadi et al. |
| 2010/0225556 A1 | 9/2010 | Rofougaran et al. |
| 2010/0225557 A1 | 9/2010 | Rofougaran et al. |
| 2010/0232323 A1 | 9/2010 | Kubler et al. |
| 2010/0246558 A1 | 9/2010 | Harel |
| 2010/0255774 A1 | 10/2010 | Kenington |
| 2010/0258949 A1 | 10/2010 | Henderson et al. |
| 2010/0260063 A1 | 10/2010 | Kubler et al. |
| 2010/0261501 A1 | 10/2010 | Behzad et al. |
| 2010/0266287 A1 | 10/2010 | Adhikari et al. |
| 2010/0278530 A1 | 11/2010 | Kummetz et al. |
| 2010/0284323 A1 | 11/2010 | Tang et al. |
| 2010/0290355 A1 | 11/2010 | Roy et al. |
| 2010/0309049 A1 | 12/2010 | Reunamäki et al. |
| 2010/0311472 A1 | 12/2010 | Rofougaran et al. |
| 2010/0311480 A1 | 12/2010 | Raines et al. |
| 2010/0329161 A1 | 12/2010 | Ylanen et al. |
| 2010/0329166 A1 | 12/2010 | Mahany et al. |
| 2010/0329680 A1 | 12/2010 | Presi et al. |
| 2011/0002687 A1 | 1/2011 | Sabat, Jr. et al. |
| 2011/0007724 A1 | 1/2011 | Mahany et al. |
| 2011/0007733 A1 | 1/2011 | Kubler et al. |
| 2011/0008042 A1 | 1/2011 | Stewart |
| 2011/0019999 A1 | 1/2011 | George et al. |
| 2011/0021146 A1 | 1/2011 | Pernu |
| 2011/0021224 A1 | 1/2011 | Koskinen et al. |
| 2011/0026932 A1 | 2/2011 | Yeh et al. |
| 2011/0045767 A1 | 2/2011 | Rofougaran et al. |
| 2011/0065450 A1 | 3/2011 | Kazmi |
| 2011/0066774 A1 | 3/2011 | Rofougaran |
| 2011/0069668 A1 | 3/2011 | Chion et al. |
| 2011/0071734 A1 | 3/2011 | Van Wiemeersch et al. |
| 2011/0086614 A1 | 4/2011 | Brisebois et al. |
| 2011/0116393 A1 | 5/2011 | Hong et al. |
| 2011/0116572 A1 | 5/2011 | Lee et al. |
| 2011/0122912 A1 | 5/2011 | Benjamin et al. |
| 2011/0126071 A1 | 5/2011 | Han et al. |
| 2011/0149879 A1 | 6/2011 | Noriega et al. |
| 2011/0158298 A1 | 6/2011 | Djadi et al. |
| 2011/0182230 A1 | 7/2011 | Ohm et al. |
| 2011/0194475 A1 | 8/2011 | Kim et al. |

(56) References Cited

U.S. PATENT DOCUMENTS

| | | |
|---|---|---|
| 2011/0200328 A1 | 8/2011 | In De Betou et al. |
| 2011/0201368 A1 | 8/2011 | Faccin et al. |
| 2011/0204504 A1 | 8/2011 | Henderson et al. |
| 2011/0206383 A1 | 8/2011 | Chien et al. |
| 2011/0211439 A1 | 9/2011 | Manpuria et al. |
| 2011/0215901 A1 | 9/2011 | Van Wiemeersch et al. |
| 2011/0222415 A1 | 9/2011 | Ramamurthi et al. |
| 2011/0222434 A1 | 9/2011 | Chen |
| 2011/0222619 A1 | 9/2011 | Ramamurthi et al. |
| 2011/0227795 A1 | 9/2011 | Lopez et al. |
| 2011/0244887 A1 | 10/2011 | Dupray et al. |
| 2011/0256878 A1 | 10/2011 | Zhu et al. |
| 2011/0268033 A1 | 11/2011 | Boldi et al. |
| 2011/0268449 A1 | 11/2011 | Berlin et al. |
| 2011/0274021 A1 | 11/2011 | He et al. |
| 2011/0281536 A1 | 11/2011 | Lee et al. |
| 2012/0052892 A1 | 3/2012 | Braithwaite |
| 2012/0177026 A1 | 7/2012 | Uyehara et al. |
| 2013/0012195 A1 | 1/2013 | Sabat, Jr. et al. |
| 2013/0070816 A1 | 3/2013 | Aoki et al. |
| 2013/0071112 A1 | 3/2013 | Melester et al. |
| 2013/0089332 A1 | 4/2013 | Sauer et al. |
| 2013/0095870 A1 | 4/2013 | Phillips et al. |
| 2013/0150063 A1* | 6/2013 | Berlin .............. H04B 10/25758 455/450 |
| 2013/0210490 A1 | 8/2013 | Fischer et al. |
| 2013/0252651 A1 | 9/2013 | Zavadsky et al. |
| 2013/0260705 A1 | 10/2013 | Stratford |
| 2014/0016583 A1 | 1/2014 | Smith |
| 2014/0022914 A1 | 1/2014 | Leimeister et al. |
| 2014/0140225 A1 | 5/2014 | Wala |
| 2014/0146797 A1 | 5/2014 | Zavadsky et al. |
| 2014/0146905 A1 | 5/2014 | Zavadsky et al. |
| 2014/0146906 A1 | 5/2014 | Zavadsky et al. |
| 2014/0219140 A1 | 8/2014 | Uyehara et al. |
| 2016/0135313 A1* | 5/2016 | Freeman ................. H01H 3/02 361/819 |
| 2017/0054496 A1* | 2/2017 | Hazani ............... H04B 10/0775 |

FOREIGN PATENT DOCUMENTS

| | | |
|---|---|---|
| CA | 2065090 C | 2/1998 |
| CA | 2242707 A1 | 1/1999 |
| CN | 101389148 A | 3/2009 |
| CN | 101547447 A | 9/2009 |
| DE | 20104862 U1 | 8/2001 |
| DE | 10249414 A1 | 5/2004 |
| EP | 0477952 A2 | 4/1992 |
| EP | 0477952 A3 | 4/1992 |
| EP | 0461583 B1 | 3/1997 |
| EP | 851618 A2 | 7/1998 |
| EP | 0687400 B1 | 11/1998 |
| EP | 0993124 A2 | 4/2000 |
| EP | 1037411 A2 | 9/2000 |
| EP | 1179895 A1 | 2/2002 |
| EP | 1267447 A1 | 12/2002 |
| EP | 1347584 A2 | 9/2003 |
| EP | 1363352 A1 | 11/2003 |
| EP | 1391897 A1 | 2/2004 |
| EP | 1443687 A1 | 8/2004 |
| EP | 1455550 A2 | 9/2004 |
| EP | 1501206 A1 | 1/2005 |
| EP | 1503451 A1 | 2/2005 |
| EP | 1530316 A1 | 5/2005 |
| EP | 1511203 B1 | 3/2006 |
| EP | 1267447 B1 | 8/2006 |
| EP | 1693974 A1 | 8/2006 |
| EP | 1742388 A1 | 1/2007 |
| EP | 1227605 B1 | 1/2008 |
| EP | 1954019 A1 | 8/2008 |
| EP | 1968250 A1 | 9/2008 |
| EP | 1056226 B1 | 4/2009 |
| EP | 1357683 B1 | 5/2009 |
| EP | 2276298 A1 | 1/2011 |
| EP | 1570626 B1 | 11/2013 |
| GB | 2323252 A | 9/1998 |
| GB | 2370170 A | 6/2002 |
| GB | 2399963 A | 9/2004 |
| GB | 2428149 A | 1/2007 |
| JP | H4189036 A | 7/1992 |
| JP | 05260018 A | 10/1993 |
| JP | 09083450 A | 3/1997 |
| JP | 09162810 A | 6/1997 |
| JP | 09200840 A | 7/1997 |
| JP | 11068675 A | 3/1999 |
| JP | 2000152300 A | 5/2000 |
| JP | 2000341744 A | 12/2000 |
| JP | 2002264617 A | 9/2002 |
| JP | 2002353813 A | 12/2002 |
| JP | 2003148653 A | 5/2003 |
| JP | 2003172827 A | 6/2003 |
| JP | 2004172734 A | 6/2004 |
| JP | 2004245963 A | 9/2004 |
| JP | 2004247090 A | 9/2004 |
| JP | 2004264901 A | 9/2004 |
| JP | 2004265624 A | 9/2004 |
| JP | 2004317737 A | 11/2004 |
| JP | 2004349184 A | 12/2004 |
| JP | 2005018175 A | 1/2005 |
| JP | 2005087135 A | 4/2005 |
| JP | 2005134125 A | 5/2005 |
| JP | 2007228603 A | 9/2007 |
| JP | 2008172597 A | 7/2008 |
| KR | 20010055088 A | 7/2001 |
| WO | 9603823 A1 | 2/1996 |
| WO | 9810600 A1 | 3/1998 |
| WO | 0042721 A1 | 7/2000 |
| WO | 0072475 A1 | 11/2000 |
| WO | 0178434 A1 | 10/2001 |
| WO | 0184760 A1 | 11/2001 |
| WO | 0221183 A1 | 3/2002 |
| WO | 0230141 A1 | 4/2002 |
| WO | 02102102 A1 | 12/2002 |
| WO | 03024027 A1 | 3/2003 |
| WO | 03098175 A1 | 11/2003 |
| WO | 2004030154 A2 | 4/2004 |
| WO | 2004047472 A1 | 6/2004 |
| WO | 2004056019 A1 | 7/2004 |
| WO | 2004059934 A1 | 7/2004 |
| WO | 2004086795 A2 | 10/2004 |
| WO | 2004093471 A2 | 10/2004 |
| WO | 2005062505 A1 | 7/2005 |
| WO | 2005069203 A2 | 7/2005 |
| WO | 2005073897 A1 | 8/2005 |
| WO | 2005079386 A2 | 9/2005 |
| WO | 2005101701 A2 | 10/2005 |
| WO | 2005111959 A2 | 11/2005 |
| WO | 2006011778 A1 | 2/2006 |
| WO | 2006018592 A1 | 2/2006 |
| WO | 2006019392 A1 | 2/2006 |
| WO | 2006039941 A1 | 4/2006 |
| WO | 2006051262 A1 | 5/2006 |
| WO | 2006060754 A1 | 6/2006 |
| WO | 2006077569 A1 | 7/2006 |
| WO | 2006105185 A2 | 10/2006 |
| WO | 2006133609 A1 | 12/2006 |
| WO | 2006136811 A1 | 12/2006 |
| WO | 2007048427 A1 | 5/2007 |
| WO | 2007077451 A1 | 7/2007 |
| WO | 2007088561 A1 | 8/2007 |
| WO | 2007091026 A1 | 8/2007 |
| WO | 2008008249 A2 | 1/2008 |
| WO | 2008027213 A2 | 3/2008 |
| WO | 2008033298 A2 | 3/2008 |
| WO | 2008039830 A2 | 4/2008 |
| WO | 2008116014 A2 | 9/2008 |
| WO | 2006046088 A1 | 5/2009 |
| WO | 2010090999 A1 | 8/2010 |
| WO | 2010132739 A1 | 11/2010 |
| WO | 2011023592 A1 | 3/2011 |
| WO | 2011100095 A1 | 8/2011 |
| WO | 2011139939 A1 | 11/2011 |

(56) References Cited

FOREIGN PATENT DOCUMENTS

| | | |
|---|---|---|
| WO | 2012148938 A1 | 11/2012 |
| WO | 2012148940 A1 | 11/2012 |
| WO | 2013122915 A1 | 8/2013 |

OTHER PUBLICATIONS

Arredondo, Albedo et al., "Techniques for Improving In-Building Radio Coverage Using Fiber-Fed Distributed Antenna Networks," IEEE 46th Vehicular Technology Conference, Atlanta, Georgia, Apr. 28-May 1, 1996, pp. 1540-1543, vol. 3.

Bakaul, M., et al., "Efficient Multiplexing Scheme for Wavelength-Interleaved DWDM Millimeter-Wave Fiber-Radio Systems," IEEE Photonics Technology Letters, Dec. 2005, vol. 17, No. 12, pp. 2718-2720.

Cho, Bong Youl et al. "The Forward Link Performance of a PCS System with an AGC," 4th CDMA International Conference and Exhibition, "The Realization of IMT-2000," 1999, 10 pages.

Chu, Ta-Shing et al. "Fiber optic microcellular radio", IEEE Transactions on Vehicular Technology, Aug. 1991, pp. 599-606, vol. 40, Issue 3.

Cooper, A.J., "Fiber/Radio for the Provision of Cordless/Mobile Telephony Services in the Access Network," Electronics Letters, 1990, pp. 2054-2056, vol. 26.

Cutrer, David M. et al., "Dynamic Range Requirements for Optical Transmitters in Fiber-Fed Microcellular Networks," IEEE Photonics Technology Letters, May 1995, pp. 564-566, vol. 7, No. 5.

Dolmans, G. et al. "Performance study of an adaptive dual antenna handset for indoor communications", IEE Proceedings: Microwaves, Antennas and Propagation, Apr. 1999, pp. 138-144, vol. 146, Issue 2.

Ellinger, Frank et al., "A 5.2 GHz variable gain LNA MMIC for adaptive antenna combining", IEEE MTT-S International Microwave Symposium Digest, Anaheim, California, Jun. 13-19, 1999, pp. 501-504, vol. 2.

Fan, J.C. et al., "Dynamic range requirements for microcellular personal communication systems using analog fiber-optic links", IEEE Transactions on Microwave Theory and Techniques, Aug. 1997, pp. 1390-1397, vol. 45, Issue 8.

Gibson, B.C., et al., "Evanescent Field Analysis of Air-Silica Microstructure Waveguides," The 14th Annual Meeting of the IEEE Lasers and Electro-Optics Society, 1-7803-7104-4/01, Nov. 12-13, 2001, vol. 2, pp. 709-710.

Huang, C., et al., "A WLAN-Used Helical Antenna Fully Integrated with the PCMCIA Carrier," IEEE Transactions on Antennas and Propagation, Dec. 2005, vol. 53, No. 12, pp. 4164-4168.

Kojucharow, K., et al., "Millimeter-Wave Signal Properties Resulting from Electrooptical Upconversion," IEEE Transaction on Microwave Theory and Techniques, Oct. 2001, vol. 49, No. 10, pp. 1977-1985.

Monro, T.M., et al., "Holey Fibers with Random Cladding Distributions," Optics Letters, Feb. 15, 2000, vol. 25, No. 4, pp. 206-208.

Moreira, J.D., et al., "Diversity Techniques for OFDM Based WLAN Systems," The 13th IEEE International Symposium on Personal, Indoor and Mobile Radio Communications, Sep. 15-18, 2002, vol. 3, pp. 1008-1011.

Niiho, T., et al., "Multi-Channel Wireless LAN Distributed Antenna System Based on Radio-Over-Fiber Techniques," The 17th Annual Meeting of the IEEE Lasers and Electro-Optics Society, Nov. 2004, vol. 1, pp. 57-58.

Author Unknown, "ITU-T G.652, Telecommunication Standardization Sector of ITU, Series G: Transmission Systems and Media, Digital Systems and Networks, Transmission Media and Optical Systems Characteristics—Optical Fibre Cables, Characteristics of a Single-Mode Optical Fiber and Cable," ITU-T Recommendation G.652, International Telecommunication Union, Jun. 2005, 22 pages.

Author Unknown, "ITU-T G.657, Telecommunication Standardization Sector of ITU, Dec. 2006, Series G: Transmission Systems and Media, Digital Systems and Networks, Transmission Media and Optical Systems Characteristics—Optical Fibre Cables, Characteristics of a Bending Loss Insensitive Single Mode Optical Fibre and Cable for the Access Network," ITU-T Recommendation G.657, International Telecommunication Union, 20 pages.

Author Unknown, RFID Technology Overview, Date Unknown, 11 pages.

Opatic, D., "Radio over Fiber Technology for Wireless Access," Ericsson, Oct. 17, 2009, 6 pages.

Paulraj, A.J., et al., "An Overview of MIMO Communications—A Key to Gigabit Wireless," Proceedings of the IEEE, Feb. 2004, vol. 92, No. 2, 34 pages.

Pickrell, G.R., et al., "Novel Techniques for the Fabrication of Holey Optical Fibers," Proceedings of SPIE, Oct. 28-Nov. 2, 2001, vol. 4578, 2001, pp. 271-282.

Roh, W., et al., "MIMO Channel Capacity for the Distributed Antenna Systems," Proceedings of the 56th IEEE Vehicular Technology Conference, Sep. 2002, vol. 2, pp. 706-709.

Schweber, Bill, "Maintaining cellular connectivity indoors demands sophisticated design," EDN Network, Dec. 21, 2000, 2 pages, http://www.edn.com/design/integrated-circuit-design/4362776/Maintaining-cellular-connectivity-indoors-demands-sophisticated-design.

Seto, I., et al., "Antenna-Selective Transmit Diversity Technique for OFDM-Based WLANs with Dual-Band Printed Antennas," 2005 IEEE Wireless Communications and Networking Conference, Mar. 13-17, 2005, vol. 1, pp. 51-56.

Shen, C., et al., "Comparison of Channel Capacity for MIMO-DAS versus MIMO-CAS," The 9th Asia-Pacific Conference on Communications, Sep. 21-24, 2003, vol. 1, pp. 113-118.

Wake, D. et al., "Passive Picocell: A New Concept n Wireless Network Infrastructure," Electronics Letters, Feb. 27, 1997, vol. 33, No. 5, pp. 404-406.

Windyka, John et al., "System-Level Integrated Circuit (SLIC) Technology Development for Phased Array Antenna Applications," Contractor Report 204132, National Aeronautics and Space Administration, Jul. 1997, 94 pages.

Winters, J., et al., "The Impact of Antenna Diversity on the Capacity of Wireless Communications Systems," IEEE Transcations on Communications, vol. 42, No. 2/3/4, Feb./Mar./Apr. 1994, pp. 1740-1751.

Yu et al., "A Novel Scheme to Generate Single-Sideband Millimeter-Wave Signals by Using Low-Frequency Local Oscillator Signal," IEEE Photonics Technology Letters, vol. 20, No. 7, Apr. 1, 2008, pp. 478-480.

Attygalle et al., "Extending Optical Transmission Distance in Fiber Wireless Links Using Passive Filtering in Conjunction with Optimized Modulation," Journal of Lightwave Technology, vol. 24, No. 4, Apr. 2006, 7 pages.

Bo Zhang et al., "Reconfigurable Multifunctional Operation Using Optical Injection-Locked Vertical-Cavity Surface-Emitting Lasers," Journal of Lightwave Technology, vol. 27, No. 15, Aug. 2009, 6 pages.

Chang-Hasnain, et al., "Ultrahigh-speed laser modulation by injection locking," Chapter 6, Optical Fiber Telecommunication V A: Components and Subsystems, Elsevier Inc., 2008, 20 pages.

Cheng Zhang et al., "60 GHz Millimeter-wave Generation by Two-mode Injection-locked Fabry-Perot Laser Using Second-Order Sideband Injection in Radio-over-Fiber System," Conference on Lasers and Electro-Optics and Quantum Electronics, Optical Society of America, May 2008, 2 pages.

Chrostowski, "Optical Injection Locking of Vertical Cavity Surface Emitting Lasers," Fall 2003, PhD dissertation University of California at Berkely, 122 pages.

Dang et al., "Radio-over-Fiber based architecture for seamless wireless indoor communication in the 60GHz band," Computer Communications, Elsevier B.V., Amsterdam, NL, vol. 30, Sep. 8, 2007, pp. 3598-3613.

Hyuk-Kee Sung et al., "Optical Single Sideband Modulation Using Strong Optical Injection-Locked Semiconductor Lasers," IEEE Photonics Technology Letters, vol. 19, No. 13, Jul. 1, 2007, 4 pages.

(56) References Cited

OTHER PUBLICATIONS

Lim et al., "Analysis of Optical Carrier-to-Sideband Ratio for Improving Transmission Performance in Fiber-Radio Links," IEEE Transactions of Microwave Theory and Techniques, vol. 54, No. 5, May 2006, 7 pages.

Lu H H et al., "Improvement of radio-on-multimode fiber systems based on light injection and optoelectronic feedback techniques," Optics Communications, vol. 266, No. 2, Elsevier B.V., Oct. 15, 2006, 4 pages.

Pleros et al., "A 60 GHz Radio-Over-Fiber Network Architecture for Seamless Communication With High Mobility," Journal of Lightwave Technology, vol. 27, No. 12, IEEE, Jun. 15, 2009, pp. 1957-1967.

Reza et al., "Degree-of-Polarization-Based PMD Monitoring for Subcarrier-Multiplexed Signals via Equalized Carrier/Sideband Filtering," Journal of Lightwave Technology, vol. 22, No. 4, IEEE, Apr. 2004, 8 pages.

Zhao, "Optical Injection Locking on Vertical-Cavity Surface-Emitting Lasers (VCSELs): Physics and Applications," Fall 2008, PhD dissertation University of California at Berkeley, pp. 1-209.

Author Unknown, "VCSEL Chaotic Synchronization and Modulation Characteristics," Master's Thesis, Southwest Jiatong University, Professor Pan Wei, Apr. 2006, 8 pages (machine translation).

Chowdhury et al., "Multi-service Multi-carrier Broadband MIMO Distributed Antenna Systems for In-building Optical Wireless Access," Presented at the 2010 Conference on Optical Fiber Communication and National Fiber Optic Engineers Conference, Mar. 21-25, 2010, San Diego, California, IEEE, pp. 1-3.

Oberon Product Catalog, "Suspended Ceiling T Wireless Access Point & DAS rem," http://www.oberonwireless.com/plenum-rated-access-point-enclosures.php, Jun. 4, 2014, 6 pages.

Seto et al., "Optical Subcarrier Multiplexing Transmission for Base Station With Adaptive Array Antenna," IEEE Transactions on Microwave Theory and Techniques, vol. 49, No. 10, Oct. 2001, pp. 2036-2041.

Biton et al., "Challenge: CeTV and Ca-Fi—Cellular and Wi-Fi over CATV," Proceedings of the Eleventh Annual International Conference on Mobile Computing and Networking, Aug. 28-Sep. 2, 2005, Cologne, Germany, Association for Computing Machinery, 8 pages.

\* cited by examiner

REMOTE UNITS FOR DISTRIBUTED COMMUNICATION SYSTEMS AND RELATED INSTALLATION METHODS AND APPARATUSES

RELATED APPLICATIONS

This application claims the benefit of priority under 35 U.S.C. §119 of U.S. Provisional Application No. 61/860,553 filed on Jul. 31, 2013, the content of which is relied upon and incorporated herein by reference in its entirety.

BACKGROUND

The disclosure relates generally to remote antenna units.

Distributed antenna systems (DASs) or distributed communication systems provide wireless communications and other services within a building, stadium, and other infrastructures. One approach to deploying a DAS involves the use of radio frequency (RF) antenna coverage areas, also referred to as "antenna coverage areas." The antenna coverage areas are provided by remote antenna units (RAUs), or more generally 'remote units' in the DAS. Remote units provide antenna coverage areas typically having radii from a few meters up to twenty (20) meters. If the antenna coverage areas each cover a small area, there are typically only a few users (clients) per antenna coverage area. This minimizes the amount of RF bandwidth shared among the wireless system users.

Remote units are commonly mounted on the ceiling in such a way that radiofrequency signals from the remote unit's antenna are not obstructed by the ceiling. If active remote antenna units are part of the DAS, the DAS designer must also ensure that the mounting structure allows for sufficient dissipation of the heat generated by remote unit's electronics. If a remote unit relies on airflow for cooling, the mounting environment must allow for relatively unobstructed airflow. It is also desirable that the remote unit mounting structure, as well as the remote unit itself, be as unobtrusive and aesthetically pleasing as possible.

FIG. 1 shows a typical remote unit 100 for use in a distributed antenna system. The remote unit 100 is attached at the lower surface 140 of a ceiling tile 150. In this arrangement, cooling air flow through the remote unit 100 may be partially blocked by the tile.

No admission is made that any reference cited herein constitutes prior art. Applicant expressly reserves the right to challenge the accuracy and pertinency of any cited documents.

DETAILED DESCRIPTION

Figure 1:
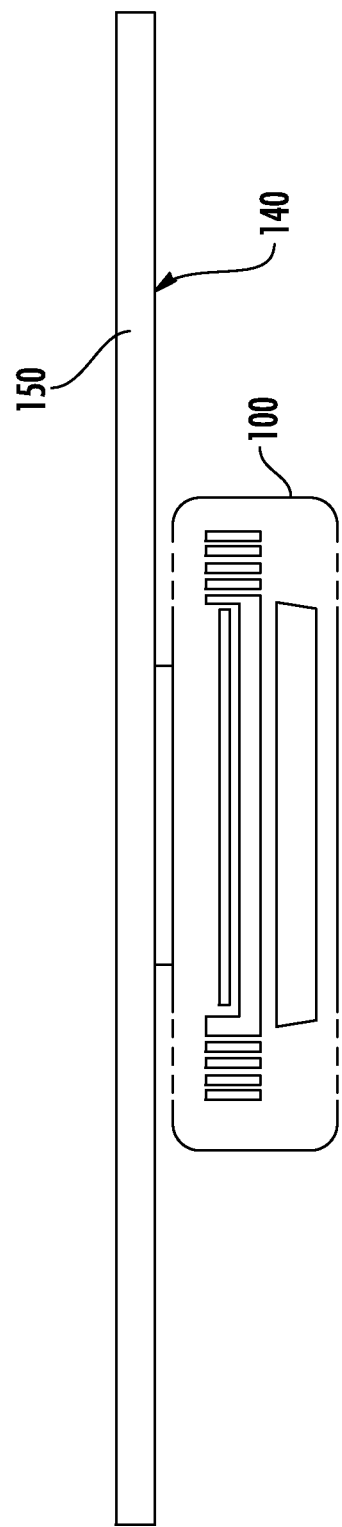
FIG. 1 illustrates a remote unit for use in a distributed communications system.
Figure 2:
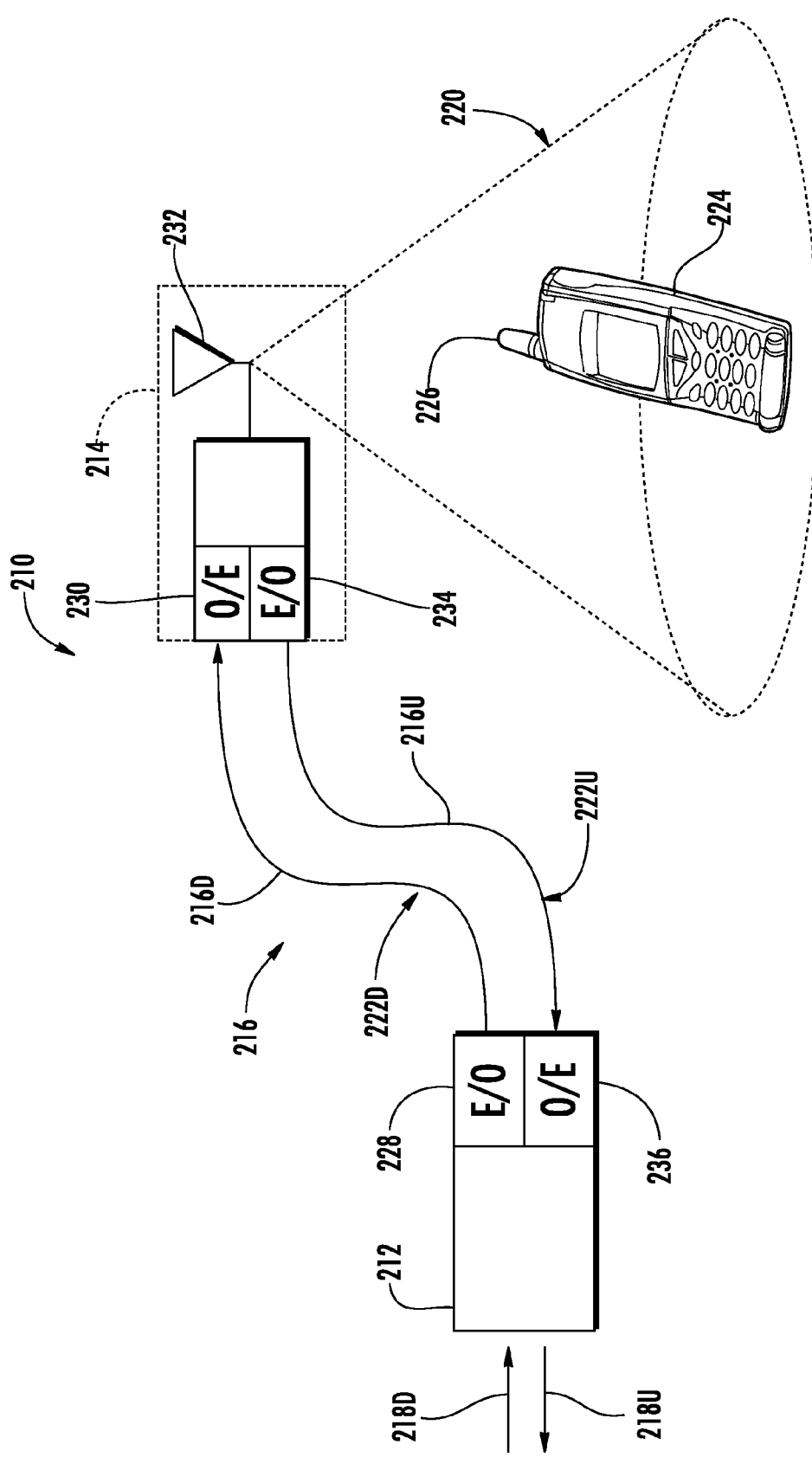
FIGS. 2 and 3 are schematic views of an exemplary optical fiber-based distributed antenna system (DAS).
Figure 3:
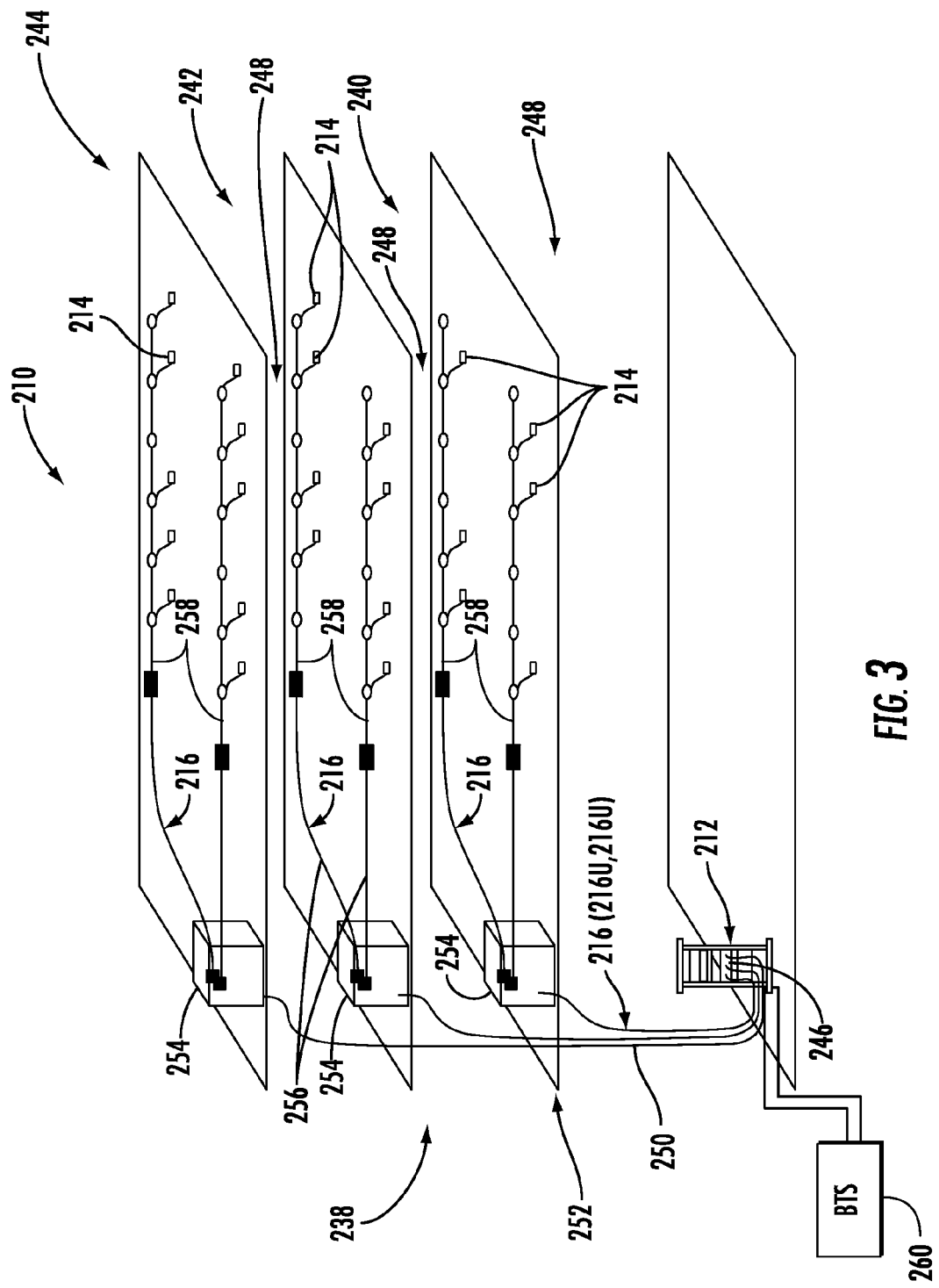
Figure 4:
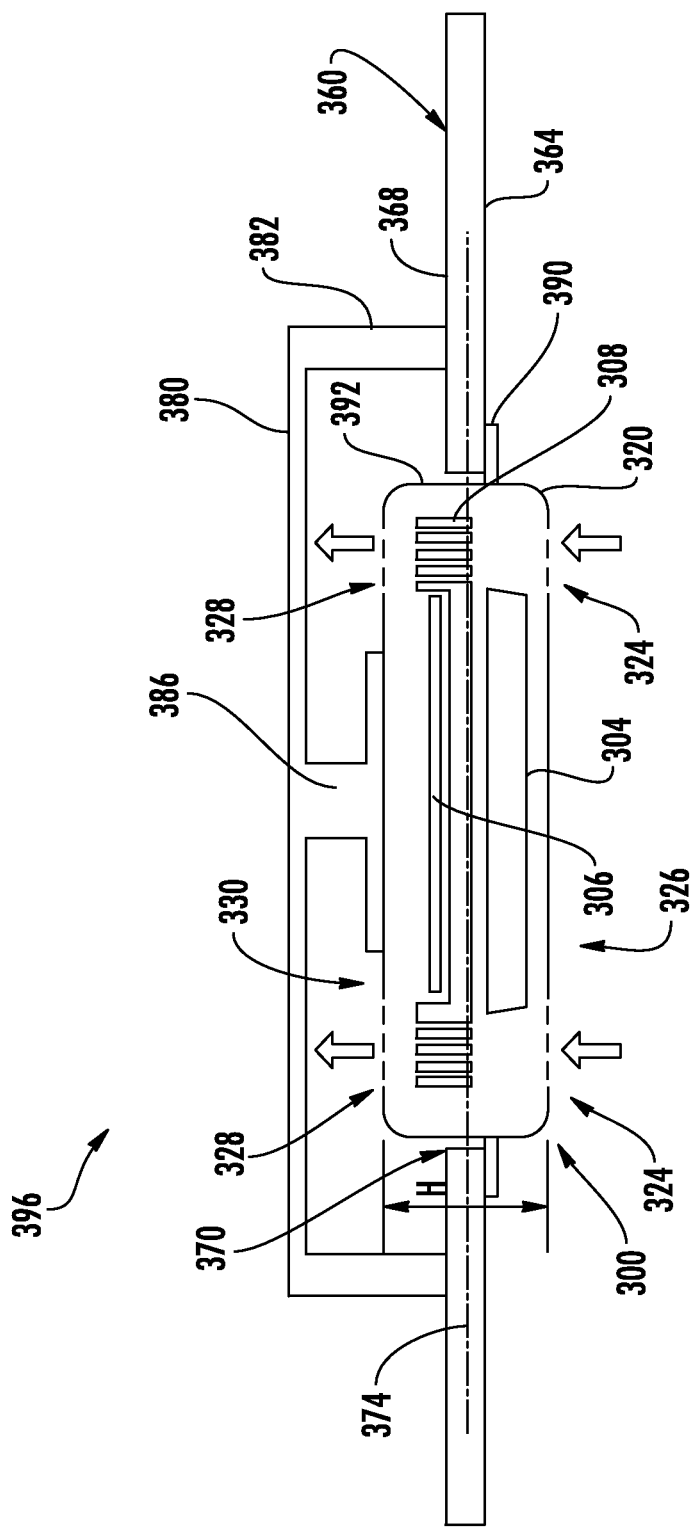
FIG. 4 is a section view of a remote unit installation according to a present embodiment.

Before discussing the remote unit installation according to the present embodiment in FIG. 4, FIGS. 2 and 3 are examples of distributed antenna systems (DASs) that can incorporate remote antenna unit installations according to the present embodiments.

FIG. 2 is a schematic diagram of an embodiment of a DAS. In this embodiment, the system is an optical fiber-based distributed communication system in the form of a DAS 210. The optical-fiber based DAS 210 is configured to create one or more antenna coverage areas for establishing communications with wireless client devices located in the radio frequency (RF) range of the antenna coverage areas. The DAS 210 provides RF communications services (e.g., cellular services). The DAS 210 includes head end equipment (HEE) in the form of a head end unit (HEU) 212, one or more remote units 214, and an optical fiber 216 that optically couples the HEU 212 to the remote unit 214.

The HEU 212 is configured to receive communications over downlink electrical RF communications signals 218D from a source or sources, such as a network or carrier as examples, and provide such communications to the remote unit 214. The HEU 212 is also configured to return communications received from the remote unit 214, via uplink electrical RF communications signals 218U, back to the source or sources. The optical fiber 216 includes at least one downlink optical fiber 216D to carry signals communicated from the HEU 212 to the remote unit 214 and at least one uplink optical fiber 216U to carry signals communicated from the remote unit 214 back to the HEU 212. One downlink optical fiber 216D and one uplink optical fiber 216U could be provided to support multiple channels, each using wavelength-division multiplexing (WDM).

The DAS 210 has an antenna coverage area 220 that can be substantially centered about the remote unit 214. The remote unit 214 is configured to receive downlink optical RF communications signals 222D from the HEU 212 and transmit the content downlink optical RF communications signals 222D wirelessly within the coverage area 220. The HEU 212 is adapted to perform or to facilitate any one of a number of wireless applications, including but not limited to Radio-over-Fiber (RoF), radio frequency identification (RFID), wireless local-area network (WLAN) communication, public safety, cellular, telemetry, and other mobile or fixed services. Shown within the antenna coverage area 220 is a client device 224 in the form of a mobile device, which may be a cellular telephone as an example. The client device 224 can be any device that is capable of receiving RF communication signals. The client device 224 includes an antenna 226 (e.g., a wireless card) adapted to receive and/or send electromagnetic RF communications signals.

The HEU 212 includes an electrical-to-optical (E/O) converter 228 to communicate the electrical RF communications signals over the downlink optical fiber 216D to the remote unit 214, to in turn be communicated to the client device 224 in the antenna coverage area 220 formed by the remote unit 214. The E/O converter 228 converts the downlink electrical RF communications signals 218D to downlink optical RF communications signals 222D to be communicated over the downlink optical fiber 216D. The remote unit 214 includes an optical-to-electrical (O/E) converter 230 to convert received downlink optical RF communications signals 222D back to electrical RF communications signals to be communicated wirelessly through an antenna 232 of the remote unit 214 to client devices 224 located in the antenna coverage area 220.

Each of the remote units 214 includes an antenna system capable of transmitting RF communications into and receiving RF communications from a coverage area. The antenna 232 is configured to receive wireless RF communications from client devices 224 in the antenna coverage area 220 and communicate electrical RF communications signals representing the wireless RF communications to an E/O converter 234 in the remote unit 214. The E/O converter 234 converts the electrical RF communications signals into uplink optical RF communications signals 222U to be communicated over the uplink optical fiber 216U. The E/O converter 234 and the O/E converter 30 constitute a "converter pair," as illustrated in FIG. 2. The E/O converter 228 includes a laser suitable for delivering sufficient dynamic range for the RoF applications described herein.

An O/E converter 236 in the HEU 212 converts the uplink optical RF communications signals 222U into uplink electrical RF communications signals, which are communicated as uplink electrical RF communications signals 218U back to a network or other source. The O/E converter 236 is a photodetector, or a photodetector electrically coupled to a linear amplifier. The E/O converter 228 and the O/E converter 236 also constitute a "converter pair."

FIG. 3 illustrates a distributed communication system deployed in a building infrastructure. The figure is a partially schematic cut-away diagram of a building infrastructure 238 with an expanded schematic of the DAS 210 deployed therein. The infrastructure 238 generally represents any type of building or other structure in which the optical fiber-based DAS 210 can be deployed, including indoor, outdoor or partially outdoor deployment sites such as stadiums. The building infrastructure 238 in this embodiment includes a first (ground) floor 240, a second floor 242, and a third floor 244. The floors 240, 242, 244 are serviced by the HEU 212 through a main distribution frame 246 to provide antenna coverage areas 248 within the building infrastructure 238. Only the ceilings of the floors 240, 242, 244 are shown in FIG. 3 for simplicity of illustration. A main cable 250 has a number of different sections that facilitate the placement of a large number of remote units 214 in the building infrastructure 238. Each remote unit 214 in turn services its own coverage area 248. Any number of remote units 214 can be deployed on each floor of the infrastructure 238. For example, at least three remote units 214 can be deployed on each of at least three, four, or five or more floors of the infrastructure 238. The main cable 250 can include, for example, a riser cable 252 that carries all of the downlink and uplink optical fibers 216D, 216U to and from the HEU 212. The riser cable 252 may be routed through an interconnect unit (ICU) 254 to one or more optical fiber cables 256. The ICU 254 may also be configured to provide power to the remote units 214.

The main cable 250 enables the multiple optical fiber cables 256 to be distributed throughout the building infrastructure 238 (e.g., fixed to the ceilings, walls, panels, or other support surfaces of each floor 240, 242, 244) to provide the antenna coverage areas 48 for the first, second and third floors 240, 242 and 244. A base transceiver station (BTS) 260 is connected to the HEU 212, and can be co-located or located remotely from the HEU 212. A BTS is any station or source that provides an input signal to the HEU 212 and can receive a return signal from the HEU 212. In a typical cellular system, for example, a plurality of BTSs are deployed at a plurality of remote locations to provide wireless telephone coverage. Each BTS serves a corresponding cell and when a mobile station enters the cell, the BTS communicates with the mobile station. Each BTS can include at least one radio transceiver for enabling communication with one or more subscriber units operating within the associated cell. Radio input could also be provided by a repeater or picocell.

The distributed communication system 210 in FIGS. 2 and 3 provides point-to-point communications between the HEU 212 and the remote units 214. Each remote unit 214 communicates with the HEU 212 over a distinct downlink and uplink optical fiber pair 216D/216U. Whenever a remote unit 214 is installed in the optical fiber-based DAS 210, the remote unit 214 is connected to a distinct downlink and uplink optical fiber pair connected to the HEU 212. The downlink and uplink optical fibers 216D/216U may be provided in the optical fiber 216. Multiple downlink and uplink optical fiber pairs 216D/216U can be provided in a fiber optic cable to service multiple remote units 214 from a common fiber optic cable. For example, with reference to FIG. 3, remote units 214 installed on a given floor 240, 242, or 244 may be serviced from the same optical fiber 216, which may have multiple nodes where distinct downlink and uplink optical fiber pairs 216D/216U are connected to a given remote unit 214.

FIG. 4 is a sectional view of a remote unit deployment according to a first embodiment. The deployment can be in any support surface, such as a wall or ceiling, ceiling tile, or other planar or generally planar surface, in a deployment infrastructure. The remote unit 300 can be generally similar or identical in function to the remote units 214 discussed above, and may include the additional features as described below. In FIG. 4, the remote unit 300 is illustrated with an antenna unit 304 for transmission of RF signals into and reception of RF signals (including, for example, voice and data information) from an RF coverage area. An electronics board 306 is attached to a heat sink 308 in order to dissipate the heat generated by the electronic components. The electronics board 306 may carry out processing and conversion functions described with reference to the remote units 214. The components of the remote unit 300 can be contained within an enclosure 320. The remote unit 300 can have all of the functionalities, components, and capabilities of the remote units 214 discussed with respect to FIGS. 2 and 3.

The enclosure 320 has first ventilation apertures 324 at a first side 326 of the enclosure 320, and second ventilation apertures 328 at a second side 330 of the enclosure. The ventilation apertures 324, 328 provide a pathway for cooling air to flow through the remote unit 300 to cool the components therein.

The exemplary remote unit 300 is deployed in a generally planar support structure 360 having a first generally planar surface 364 and a second generally planar surface 368. The support structure 360 has a mounting aperture 370 that can, for example, generally conform to the shape of the exterior periphery of the enclosure 320. Examples of exterior peripheral shapes of the enclosure 320 are discussed below with reference to FIGS. 5 and 6. In the mounting configuration illustrated in FIG. 4, a plane 374 extending through the support structure 360 also extends through the enclosure 320, so that the first side of the remote unit enclosure 320 extends past (or, below in FIG. 4) the plane of the first generally planar surface 364, and the second side 330 of the remote unit enclosure 320 extends past (or, above in FIG. 4) the plane of the second generally planar surface 368.

A mounting component 380 supports the remote unit 300 within the support structure 360. The mounting component 380 can have a support mount 382 configured to connect to and/or abut the support structure 360. The support mount 382 can have a continuous mounting periphery contacting the support structure, or individual projections or 'legs'. The mounting component 380 can also have a remote mount 386 that connects to the enclosure 320 to secure the remote unit 300 to the mounting component 380 and to hold the remote unit 300 in place within the support structure 360. In the illustrated embodiment, the remote mount 386 is secured to the second, or upper, side 330 of the enclosure 320. A peripheral flange 390 can be included around the periphery 392 of the enclosure 320. The peripheral flange 390 can abut a surface of the support structure 360, which in the illustrated embodiment is the first generally planar surface, or lower surface, 364. The peripheral flange 390 can serve the purposes of more securely fixing the remote unit 300 to the support structure 360, and of hiding the mounting aperture 370 from view. The mounting component 380 can be formed from a skeletal frame with few large surfaces so that it does not unduly obstruct air flowing into and out of the ventilation aperture 328.

The illustrated arrangement of the remote unit 300 in the support structure provides advantageous cooling properties to the installation. In one exemplary mode of operation of the remote unit 300, air flow, indicated by the large arrows, enters the first side 324 of the remote unit 300 through the first ventilation apertures 324, flows over fins of the heat sink 308, and exits the second side 330 of the remote unit 300 through the second ventilation apertures 328. Heat generated through operation of the remote unit 300 is thus dissipated from the heat sink 308 and from the other components. The flow of air through the remote unit 300 can be essentially continuous, and can flow from first side to second, and vice versa. Ambient temperature conditions on either side of the support structure 360 can drive movement of air through the remote unit 300. If desired, a fan (not illustrated) can be included in the remote unit 300 to drive cooling air through the enclosure 320.

According to the above described embodiment, the surface of the support structure 360 does not impede the flow of cooling air through the remote unit 300, and cooling air travels freely between first and second sides of the support structure 360. A minimal structure (e.g., skeletal) of the mounting component 380 allows air to pass freely into and out of the second ventilation apertures 328.

The remote unit 300 also has an aesthetic advantage in that it protrudes only slightly from the first generally planar surface 364 of the mounting structure 360. One possible mounting arrangement of the remote unit 300 is a ceiling mounting, in which the support structure 360 corresponds to a section of ceiling, such as a ceiling tile. In this embodiment, the first generally planar surface 364 is the lower surface of the ceiling visible from below to occupants of the infrastructure. In typical office, commercial, etc. environments, it is preferable for electronic components such as the remote unit 300 to be as unobtrusive as possible. The remote unit 300, labeled with a height H, has only a portion of its height H protruding from the first surface 364 of the support structure 360 so that less of the remote unit is exposed to view by occupants. According to one aspect, less than three quarters of the height H of the remote unit 300 can extend past the surface 364. According to another aspect, less than half of the height H can extend past the surface 364. The mounting arrangement can be designed to allow a small portion of the remote unit 300 to protrude beyond the surface 364 so that the support structure 360 does not interfere with RF transmissions from the antenna unit 304.

According to another aspect, the support structure 360, the remote unit 300, and the mounting component 380 can be provided as an installation assembly 396. The installation assembly 396 can be assembled as a unit before delivery to a deployment site, for example, or delivered as a collection of components to be wholly or partially assembled on site. In one such application, the support structure 360 can correspond in dimension to standardized ceiling tiles. For example, conventional two (2) foot square ceiling tiles can be adapted to accommodate a ceiling mounting arrangement of a remote unit. The ceiling tile can be made from conventional materials such as those found in commercial building drop ceilings, such as mineral fiber pulp (e.g. gypsum and cellulose fiber) held together by a binder. When installing a preassembled installation assembly 396, the technician drops the installation assembly 396 into the building's ceiling tile support frame (not shown) as in the case of installing a conventional ceiling tile. The remote unit 300 can then be connected to external cables, such as cables having optical fibers or electrical conductors for transmitting voice, data, etc. information, and electrical conductors for conveying power and information (not shown).

If the installation assembly 396 is not preassembled, or only partially assembled, the installation process can take place in separate steps. For example, the mounting structure 380 can be provided as secured to the support structure 360, and that subassembly can be dropped into the ceiling tile support frame. The remote unit 300 can then be secured to the mounting structure 380. The flange 390 can be an integral part of the enclosure 320, or mounted to the enclosure 320 or the support structure 360 in a separate step. The remote unit 300 is then connected to external data, RF, and/or power cabling.

An installation assembly may also include a support structure integrally formed with the enclosure 320, so that a separate remote mount is not required to attach the remote unit 300 to the support structure. The installation assembly can then be dropped into an existing drop ceiling support frame, for example, and connected to external data, RF, and/or power cabling. In this example, the support structure can be formed from a thin metallic plate having an aperture configured to receive the remote unit 300, and an exterior periphery configured to rest in a drop ceiling support frame.

The mounting arrangement in FIG. 4 need not be deployed as a ceiling mount. A wall mount in a vertically extending support structure is also possible.

Figure 5:
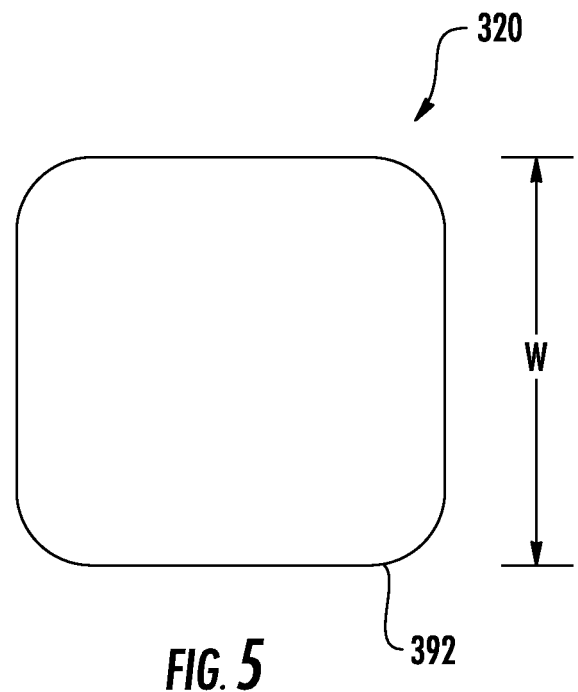
FIGS. 5 and 6 are schematic top plan views of exemplary remote units.
Figure 6:
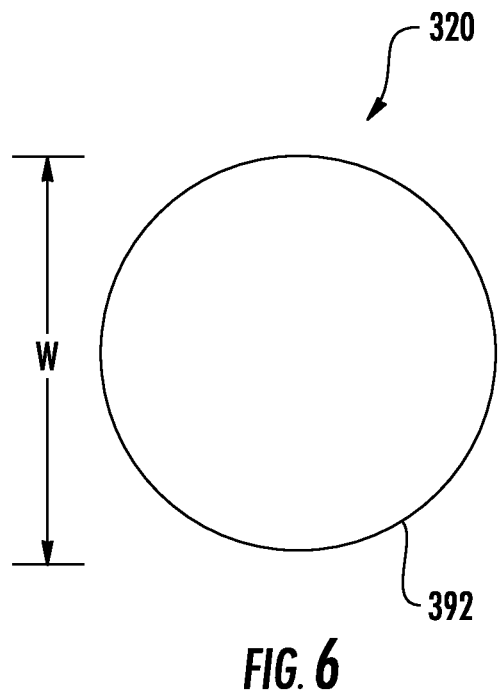

FIGS. 5 and 6 are schematic top plan views of exemplary remote unit peripheral shapes. The exemplary remote units have generally flat, disc-like shapes. The width dimension W in thus can be at least two, three or more times are large as the height dimension H shown in FIG. 4. FIG. 5 illustrates a generally rectangular, in this case square, peripheral shape having rounded corners. FIG. 6 illustrates a round peripheral shape.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred.

It will be apparent to those skilled in the art that various modifications and variations can be made without departing from the spirit or scope of the invention. Since modifications combinations, sub-combinations and variations of the disclosed embodiments incorporating the spirit and substance of the invention may occur to persons skilled in the art, the invention should be construed to include everything within the scope of the appended claims and their equivalents.

What is claimed is:

1. An installation assembly for a remote unit of a distributed communication system, comprising:

a remote unit comprising an enclosure and at least one antenna unit capable of transmitting RF communication signals into a coverage area, the remote unit being configured for mounting within a mounting aperture of a support structure so that a first side of the remote unit is visible at a first side of the support structure and a second side of the remote unit is opposite to the first side of the remote unit; and a mounting component secured to the remote unit, wherein the remote unit has at least one ventilation aperture to allow cooling air to flow between the first and second sides of the remote unit and between the first side and a second side of the support structure.

2. The installation assembly of claim 1, wherein the mounting component includes a support mount configured to abut the second side of the support structure and a remote mount connected to the second side of the enclosure.

3. The installation assembly of claim 1, further comprising a flange configured to at least partially cover the mounting aperture.

4. The installation assembly of claim 1, wherein the remote unit comprises a circuit board and a heat sink.

5. The installation assembly of claim 1, wherein the first and second sides of the support structure are generally planar surfaces.

6. The installation assembly of claim 1, wherein the at least one ventilation aperture comprises a plurality of first ventilation apertures at a first side of the enclosure and a plurality of second ventilation apertures at a second side of the enclosure.

7. The installation assembly of claim 1, wherein the first side of the remote unit protrudes beyond the first side of the support structure.

8. The installation assembly of claim 1, wherein the second side of the remote unit protrudes beyond the second side of the support structure.

9. An installation assembly for a remote unit of a distributed communication system, comprising:

a support structure having a first side, a second side, and a mounting aperture extending from the first side to the second side;

a remote unit comprising an enclosure and at least one antenna unit capable of transmitting RF communication signals into a coverage area, the remote unit being disposed within the mounting aperture so that a first side of the remote unit is visible at the first side of the support structure; and a mounting component secured to the remote unit and secured to the support structure, wherein the remote unit has at least one ventilation aperture to allow cooling air to flow between the first and second sides of the remote unit and between the first side and second sides of the support structure.

10. The installation assembly of claim 9, wherein the mounting component includes a support mount configured to abut the second side of the support structure.

11. The installation assembly of claim 9, further comprising a flange configured to at least partially cover the mounting aperture.

12. The installation assembly of claim 9, wherein the remote unit comprises a circuit board and a heat sink.

13. The installation assembly of claim 9, wherein the first and second sides of the support structure are generally planar surfaces.

14. The installation assembly of claim 9, wherein the at least one ventilation aperture comprises a plurality of first ventilation apertures at a first side of the enclosure and a plurality of second ventilation apertures at a second side of the enclosure.

15. The installation assembly of claim 9, wherein the first side of the remote unit protrudes beyond the first side of the support structure.

16. The installation assembly of claim 9, wherein the second side of the remote unit protrudes beyond the second side of the support structure.

17. The installation assembly of claim 9, wherein the remote unit has height H extending generally perpendicular to the support surfaces and a width W, the width W being at least twice the height H.

18. The installation assembly of claim 9, wherein the support structure is adapted to be accommodated within a building ceiling tile support frame.

19. The installation assembly of claim 9, wherein the support structure is generally rectangular and is adapted to be accommodated within a ceiling tile support frame for ceiling tiles having sides two feet in length.

20. The installation assembly of claim 9, wherein the support structure comprises either a section of a wall or a ceiling in a deployment infrastructure.

* * * * *